US008836042B2

(12) United States Patent
Ueno

(10) Patent No.: US 8,836,042 B2
(45) Date of Patent: Sep. 16, 2014

(54) SEMICONDUCTOR DEVICE COMPRISING AN IGBT AND A CONSTANT VOLTAGE CIRCUIT HAVING SWITCHES AND NORMALLY-ON TYPE MOSFETS CONNECTED IN PARALLEL

(75) Inventor: Katsunori Ueno, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 1230 days.

(21) Appl. No.: 12/539,339

(22) Filed: Aug. 11, 2009

(65) Prior Publication Data
US 2010/0059028 A1 Mar. 11, 2010

(30) Foreign Application Priority Data

Aug. 11, 2008 (JP) ................................ 2008-207480

(51) Int. Cl.
| | |
|---|---|
| H01L 27/06 | (2006.01) |
| F02P 11/02 | (2006.01) |
| H03K 17/082 | (2006.01) |
| H01L 29/08 | (2006.01) |
| H01L 29/06 | (2006.01) |
| H01L 27/088 | (2006.01) |
| F02P 3/05 | (2006.01) |
| H01L 29/739 | (2006.01) |
| H03K 17/0812 | (2006.01) |

(52) U.S. Cl.
CPC .............. *H01L 29/7395* (2013.01); *F02P 11/02* (2013.01); *H03K 17/0828* (2013.01); *H01L 29/0847* (2013.01); *H01L 29/0696* (2013.01); *H01L 27/0883* (2013.01); *F02P 3/051* (2013.01); *H01L 27/0623* (2013.01); *H03K 17/08128* (2013.01)
USPC ........... 257/370; 257/140; 257/355; 257/378; 257/E27.015; 257/E27.017; 361/93; 361/100; 361/101; 123/605; 123/644; 123/651

(58) Field of Classification Search
CPC ...... H02H 9/025; H02H 9/046; H02H 11/007
USPC .......... 257/205, 370, 355, 378, 555, E27.015, 257/E27.017, 140, 339, 229, 565, 575; 123/594, 605, 623, 628, 651; 361/93, 361/100, 101
See application file for complete search history.

(56) References Cited

U.S. PATENT DOCUMENTS

| | | | | |
|---|---|---|---|---|
| 5,128,823 | A * | 7/1992 | Fujimoto et al. | ............. 361/93.9 |
| 5,603,308 | A * | 2/1997 | Ooyabu et al. | ................ 123/644 |

(Continued)

FOREIGN PATENT DOCUMENTS

| | | |
|---|---|---|
| JP | 4-36257 U | 3/1992 |
| JP | 10-037833 A | 2/1998 |

(Continued)

OTHER PUBLICATIONS

Insulated gate bipolar transistor (IGBT): theory and design /Khanna, Vinod Kumar Wiley-Interscience, c2003. p. 12-14.*

(Continued)

*Primary Examiner* — Marcos D. Pizarro
*Assistant Examiner* — Cesar Lopez
(74) *Attorney, Agent, or Firm* — Rossi, Kimms & McDowell LLP

(57) ABSTRACT

A semiconductor device includes an IGBT, a constant voltage circuit, and protection Zener diodes. The IGBT makes/breaks a low-voltage current flowing in a primary coil. The constant voltage circuit and the protection Zener diodes are provided between an external gate terminal and an external collector terminal. The constant voltage circuit supplies a constant gate voltage to the IGBT to thereby set a saturation current value of the IGBT to a predetermined limiting current value. The IGBT has the saturation current value in a limiting current value range of the semiconductor device.

17 Claims, 20 Drawing Sheets

(56) References Cited

U.S. PATENT DOCUMENTS

| | | | |
|---|---|---|---|
| 6,378,514 B1* | 4/2002 | Kaminaga et al. | 123/633 |
| 2005/0061306 A1 | 3/2005 | Naruse et al. | |
| 2005/0213275 A1* | 9/2005 | Kitagawa | 361/93.1 |
| 2005/0252496 A1* | 11/2005 | Ando et al. | 123/644 |

FOREIGN PATENT DOCUMENTS

| | | |
|---|---|---|
| JP | 2000-310173 A | 11/2000 |
| JP | 2000-312144 A | 11/2000 |
| JP | 2001-345688 A | 12/2001 |
| JP | 2002-004991 A | 1/2002 |
| JP | 2003-214307 | 7/2003 |
| JP | 2005-098143 | 4/2005 |
| JP | 3842259 | 8/2006 |
| WO | 01/22584 A1 | 3/2001 |

OTHER PUBLICATIONS

Notification of Reasons for Refusal for corresponding JP 2008-207480, dated May 21, 2013. Partial translation provided.

* cited by examiner

SEMICONDUCTOR DEVICE COMPRISING AN IGBT AND A CONSTANT VOLTAGE CIRCUIT HAVING SWITCHES AND NORMALLY-ON TYPE MOSFETS CONNECTED IN PARALLEL

BACKGROUND OF THE INVENTION

The present invention relates to a semiconductor device. Particularly it relates to a current-limited semiconductor device connected to a load.

An example of a current-limited semiconductor device is an internal combustion engine ignition device (igniter). The internal combustion engine ignition device is a device, for example, that is provided for controlling a gasoline engine used in a car or the like, which is provided with a spark plug for starting combustion by igniting an air-fuel mixture such as an air-gasoline mixture imported into a combustion chamber. FIG. 18 is a conceptual view showing an example of the internal combustion engine ignition device. As shown in FIG. 18, the internal combustion engine ignition device includes primary and secondary coils 201 and 202 provided as ignition coils, a switching unit 203 which turns on and off a low-voltage current flowing in the primary coil 201, a battery 204 which supplies electric power to the ignition coils, and a spark plug 205 which ignites the air-fuel mixture by discharging a high-voltage current induced in the secondary coil 202 in accordance with the turning-on/off of the low-voltage current flowing in the primary coil 201. The switching unit 203 has an amplification function for amplifying a feeble electric signal, and a switching function. Although a bipolar transistor has been used for achievement of the amplification function and the switching function, the bipolar transistor has been replaced by an IGBT (Insulated Gate Bipolar Transistor) in recent years.

A device has been proposed as an internal combustion engine ignition device using an IGBT. That is, an internal combustion engine ignition semiconductor device has: a DC power supply and a switching unit connected to a primary winding of an ignition coil; and a spark plug connected to one end of a secondary winding of the ignition coil, in which a high voltage generated in the secondary winding in accordance with change of a primary current in the ignition coil based on the switching-on/off operation of the switching unit is supplied to the spark plug. The switching unit is an MOS gate structure transistor. In order to limit the coil current of the primary winding to a certain predetermined value, the switching unit at least has a coil current detecting portion, and a circuit for dropping a gate voltage of the MOS gate structure transistor. The internal combustion engine ignition semiconductor device has a current supply circuit for applying a voltage induced by a current flowing into a gate terminal from a main terminal of the MOS gate structure transistor to the gate terminal when the voltage of the main terminal on a high voltage side is higher than the voltage of the gate terminal. In the internal combustion engine ignition semiconductor device, the current supply circuit is composed of at least a plurality of constant current elements connected in series. On this occasion, each of the constant current elements is a depression type IGBT or a depression type MOSFET (MOS gate field-effect transistor) (e.g. see JP-A-2000-310173).

Another device has been proposed as an internal combustion engine ignition device. That is, an ignition semiconductor device is equipped with a switching device which is connected to an ignition coil in series and provided for controlling switching-on/off of a current flowing in the ignition coil, a current limiting circuit which controls the switching device to limit the current flowing in the ignition coil, and a voltage limiting circuit which clamps a voltage released from the ignition coil. The ignition semiconductor device further has a timer circuit which starts its operation in response to an input signal applied to a drive terminal of the switching device and outputs an output signal after elapse of a predetermined time since application of the input signal, and a main current progressive reduction circuit which reduces the current flowing in the switching device in response to the output signal of the timer circuit regardless of continuous application of the input signal. An IGBT is used as the switching device which is an output-stage element in the ignition semiconductor device (e.g. see JP-A-2002-004991).

Generally, both low on-voltage characteristic and low switching loss characteristic are required of an IGBT, for example, used in an inverter for a switching purpose. Although low switching loss characteristic is also required of an IGBT used in an internal combustion engine ignition device, the importance of the low switching loss characteristic of the internal combustion engine ignition device is lower than that of the inverter. This is because the switching operation time of the internal combustion engine ignition device, for example, expressed in terms of a switching time of about 10 µs and a switching frequency of 1 kHz is lower than that of the inverter or the like so that the necessity of considering switching loss is low. For this reason, in the internal combustion engine ignition device, importance can be placed on on-voltage reduction with respect to low on-voltage characteristic and low switching loss characteristic which have a trade-off relation. When a low on-voltage is achieved, the steady loss of the internal combustion engine ignition device can be reduced.

A current flowing in the primary side is limited by a total resistance value of on-resistance of the IGBT and resistance of the ignition coil connected in series. If the on-resistance of the IGBT can be reduced, the degree of freedom for adjusting an inductance value increases because a margin can be given to the resistance of the ignition coil. The increase in the degree of freedom for adjusting the inductance value permits the ignition coil to be easily designed.

The following device has been proposed as an internal combustion engine ignition device in which an on-voltage is reduced. That is, the device has a semiconductor switching element, an overcurrent protecting circuit, and an overcurrent limiting circuit. The semiconductor switching element has a gate terminal, and first and second terminals, in which a main current flows between the first and second terminals when a voltage is applied to the gate terminal. The overcurrent protecting circuit reduces the main current at a first gradient and then reduces the main current at a second gradient steeper than the first gradient when the main current becomes an overcurrent exceeding a predetermined current for a predetermined time or longer. The overcurrent limiting circuit reduces the voltage of the gate terminal instantaneously when the main current becomes an overcurrent further larger than the overcurrent for a time shorter than the predetermined time (e.g. see JP-A-2001-345688).

In the internal combustion engine ignition device, it is however necessary to ensure tolerance to breakdown due to a high-voltage current returned from the secondary coil 202 to the primary coil 201 when the spark plug 205 (see FIG. 18) fails in electric discharge. Because the semiconductor device needs to have a predetermined volume in order to ensure the tolerance of the semiconductor device, it is impossible to make the size of the semiconductor element smaller than a certain predetermined size. For this reason, achievement of low on-resistance cannot lead to cost reduction based on reduction of the size of the semiconductor device.

The internal combustion engine ignition device is provided with a current limiting function which is one function for preventing breakdown. The provision of the current limiting function prevents the coil from being burned out or cut off by an overcurrent and prevents the semiconductor element from being broken down by temperature rise. FIG. 19 is a circuit diagram showing an example of an internal combustion engine ignition device provided with a current limiting function. As shown in FIG. 19, the internal combustion engine ignition device has a main IGBT 103 which makes a low-voltage current flow into a primary coil (see FIG. 18), and a current limiting circuit 107 which controls a current flowing in the main IGBT 103. Protection Zener diodes 104 to 106 are connected.

The current limiting circuit 107 has a sense IGBT 111 which is provided on the side of an external collector terminal 102 and which monitors a current flowing in the main IGBT 103. The current limiting circuit 107 has a sense resistor 112 which is connected between an emitter of the sense IGBT 111 and the ground and which monitors a sense voltage at a node 113 near the emitter of the sense IGBT 111. In addition, the current limiting circuit 107 has a comparator 114, and an MOSFET 116. The comparator 114 detects the fact that the sense voltage at the node 113 reaches a predetermined voltage value. The MOSFET 116 controls the opening/closing state of a gate of the main IGBT 103 in accordance with a result of the detection by the comparator 114. A Vref circuit 115 which sets a voltage value as a reference sense voltage value in advance is connected to the comparator 114. The comparator 114 detects the fact that the sense voltage at the node 113 reaches the voltage value set in the Vref circuit 115. The MOSFET 116 turns off a gate signal of an external gate terminal 101 to thereby limit a current value in the main circuit to a desired range.

Further, since a limiting current value varies according to variation in electric characteristic of a semiconductor element in a real manufacturing process, for example, a trimming circuit or the like is provided. The trimming circuit adjusts the value of the current flowing in the semiconductor element to a desired limiting current value range. For example, there is used a method of making adjustment by trimming the resistance value of the sensor resistor 112 and the reference voltage of the Vref circuit 115.

The following device has been proposed as an internal combustion engine ignition device having a current limiting function. That is, an internal combustion engine ignition device includes an ignition coil, and a switching circuit. The ignition coil has a primary coil, and a secondary coil. The switching circuit breaks a current in the primary coil of the ignition coil based on an ignition signal voltage to thereby generate a high voltage in the secondary coil of the ignition coil for ignition. The ignition signal voltage is a pulse voltage including a leading edge and a trailing edge. The switching circuit does not have any power supply terminal but has an output terminal connected to the primary coil of the ignition coil, an input terminal receiving the ignition signal voltage, and a reference potential terminal. The switching circuit has a switching element, a drive resistor, and a current supply circuit. The switching element is connected between the output terminal and the reference potential terminal so that a current is made to flow into the primary coil of the ignition coil when the switching element is turned on, and the current in the primary coil is broken when the switching element is turned off. The drive resistor is provided opposite to the switching element. The current supply circuit is connected between the input terminal and the reference potential terminal so that the current supply circuit supplies a drive current to the drive resistor. The current supply circuit starts supply of the drive current at the leading edge based on the ignition signal voltage to thereby turn on the switching element, and the current supply circuit breaks the drive current at the trailing edge to thereby turn off the switching element. The current supply circuit further includes a constant current circuit which keeps the drive current constant and supplies the constant drive current to the drive resistor (e.g. see Japanese Patent No. 3842259).

The following device has been proposed as another internal combustion engine ignition device having a current limiting function. The internal combustion engine ignition device includes an ignition coil, an ignition switching unit, and a spark plug. The ignition coil has a primary winding, and a secondary winding. When a primary current flowing in the primary winding is broken, a high voltage for ignition is generated in the secondary winding. The ignition switching unit makes/breaks the primary current flowing into the primary winding of the ignition coil. The spark plug is connected to the secondary winding so that spark discharge is generated when the high voltage for ignition is applied to the spark plug.

The internal combustion engine ignition device further includes a primary current limiting unit which limits a increase rate of the primary current for a predetermined period since the start time of current conduction in the primary coil so that false ignition can be prevented from being caused in the internal combustion engine by spark discharge generated in the spark plug in a different time from the ignition time by an induced voltage reversed in polarity to the ignition high voltage generated in the second coil in accordance with the current conduction in the primary coil (e.g. see JP-A-2003-214307).

In the aforementioned current limiting circuit 107 (see FIG. 19), however, there is a feedback loop which controls a gate signal to keep a current value at a constant value after the current flowing in the main IGBT 103 increases and reaches a desired current value. FIG. 20 is a characteristic graph showing the waveforms of a gate signal and a collector current at the time of current limiting operation. As shown in FIG. 20, when the gate signal is turned on at a first time $t_1$, the collector current $I_c$ begins to increase based on an induced load (L load). When the collector current $I_c$ reaches a desired current value $I_{control}$ at a second time $t_2$, the current limiting circuit 107 starts to operate. On this occasion, there is a time lag $\Delta t$ before control of the gate signal starts to work. The collector current $I_c$ increases continuously during the time lag $\Delta t$. For this reason, the collector current $I_c$ exceeds the desired current value $I_{control}$ (hereinafter referred to as current overshoot) at a third time $t_3$ when control of the gate signal works. When the gate signal is controlled, the collector current $I_c$ decreases suddenly to the desired current value $I_{control}$ from a maximum current value $I_{peak}$ increased by the current overshoot. The current waveform is apt to be vibrated (like the current waveform designated by a double-dash chain line in FIG. 20) by the feedback loop then performed continuously for keeping the current value at the desired current value $I_{control}$.

This phenomenon arises from deviation of the limiting current value due to the difference in bias condition between the main IGBT 103 and the sense IGBT 111 because the sense resistor 112 is connected to the emitter side of the sense IGBT 111. It is hence very difficult to keep balance in the control circuit. In addition, since the current control circuit has a complicated structure and requires the sense IGBT, the control circuit is large-sized. For this reason, there occurs a problem that the total size of the semiconductor device is large to result in cost increase. Particularly in the internal combustion engine ignition device, the ratio of the control circuit to the semiconductor device as a whole becomes large because the area of the main IGBT per se is about several mm$^2$.

In the internal combustion engine ignition device, the main IGBT 103 and the control circuit including the current limiting circuit 107, etc. can be formed integrally on one semiconductor substrate. On this occasion, a gate signal is generated by use of a horizontal type n-channel MOSFET and a depression type (normally-on type) MOSFET. The depression type MOSFET is turned on when a gate voltage is not applied thereto, but the depression type MOSFET is turned off at the time of operation. A power voltage for these MOSFETs may be supplied from another external power supply or may be supplied as an external gate signal. When the power voltage for these MOSFETs is supplied from another external power supply, the power supply voltage varies little. However, when the power voltage is supplied as an external gate signal, the voltage value of the gate signal varies widely according to a load state, etc. imposed on the circuit.

SUMMARY OF THE INVENTION

In order to solve the foregoing problems inherent to the devices described above, the invention provides a semiconductor device which can suppress vibration of the waveform of a current flowing in a main IGBT to thereby keep a gate voltage constant. Further, the invention provides a semiconductor device which proposes a small-size simple control circuit to attain reduction of the total size of the semiconductor device to thereby reduce cost.

In order to solve the foregoing problems and achieve the objects, in accordance with the invention, there is provided a semiconductor device including an IGBT, and a constant voltage circuit which applies a constant voltage to a gate of the IGBT to limit a saturation current value of the IGBT to a value not larger than a limiting current value.

Further, the semiconductor device can be provided with a resistor is connected to an emitter of the IGBT.

Further, the semiconductor device includes an IGBT formed in a trench gate structure or a planar gate structure.

Further, at least the IGBT and the constant voltage circuit are formed integrally on one and the same semiconductor substrate.

Further, at least the IGBT and the constant voltage circuit can be formed separately on different semiconductor substrates.

Further, the resistor can be formed on an emitter-side surface layer of the IGBT.

Further, the resistor can be formed in a diffusion region in a source region of the IGBT.

Further, the resistor can be formed in wiring containing aluminum as a main component.

Further, the resistor can be formed on a semiconductor substrate where the constant voltage circuit has been formed.

According to the invention, an internal combustion engine is provided with an ignition device including an IGBT which is connected in series to a primary coil of an ignition coil and which makes/breaks a current flowing in the primary coil, and a spark plug which is connected in series to a secondary coil of the ignition coil and which discharges a high voltage generated in the secondary coil due to the making/breaking of the IGBT, wherein the internal combustion engine ignition device further includes a constant voltage circuit which applies a constant voltage to a gate of the IGBT to limit a saturation current value of the IGBT to a value not larger than a limiting current value.

According to the invention, the IGBT having the saturation current value in the limiting current value range of the semiconductor device is used in place of a current limiting circuit using a sense IGBT, so that a feedback loop can be eliminated. In addition, the use of saturation characteristic of the IGBT brings the current flowing in the IGBT to a current limiting state naturally without exceeding the saturation current value of the IGBT. Accordingly, current overshoot does not occur, so that vibration of the waveform of the current flowing in the IGBT can be suppressed. In this manner, a gate voltage can be kept constant. In addition, since a current limiting circuit requiring a complicated structure is not used, a control circuit can be made small-sized and simple. Thus, the total size of the semiconductor device can be reduced to attain cost reduction.

According to the to the invention, there is an effect that vibration of the waveform of the current flowing in the IGBT can be suppressed to thereby keep a gate voltage constant. In addition, there is another effect that the total size of the semiconductor device can be reduced to attain cost reduction.

These an other features, advantages, embodiments, etc. will become apparent to those skilled in the art from the following detailed description of the preferred embodiments.

BRIEF DESCRIPTION OF THE DRAWINGS

The invention will now be described with reference to certain preferred embodiments thereof and the accompany drawings, wherein.

DETAILED DESCRIPTION OF THE PREFERRED EMBODIMENTS

Preferred embodiments of a semiconductor device according to the invention will be described below in details with reference to the accompanying drawings. Incidentally, like parts as those in the following description of the embodiments and all the accompanying drawings will be referred to by like numerals so that duplicate description thereof will be omitted. In the specification, a semiconductor crowned with n or p means that electrons or holes are majority carriers in the semiconductor. The superscript "+" or "−" attached to n or p like n+, n−, etc. expresses a higher or lower impurity concentration than that of a semiconductor without the superscript "+" or "−".

Figure 1:
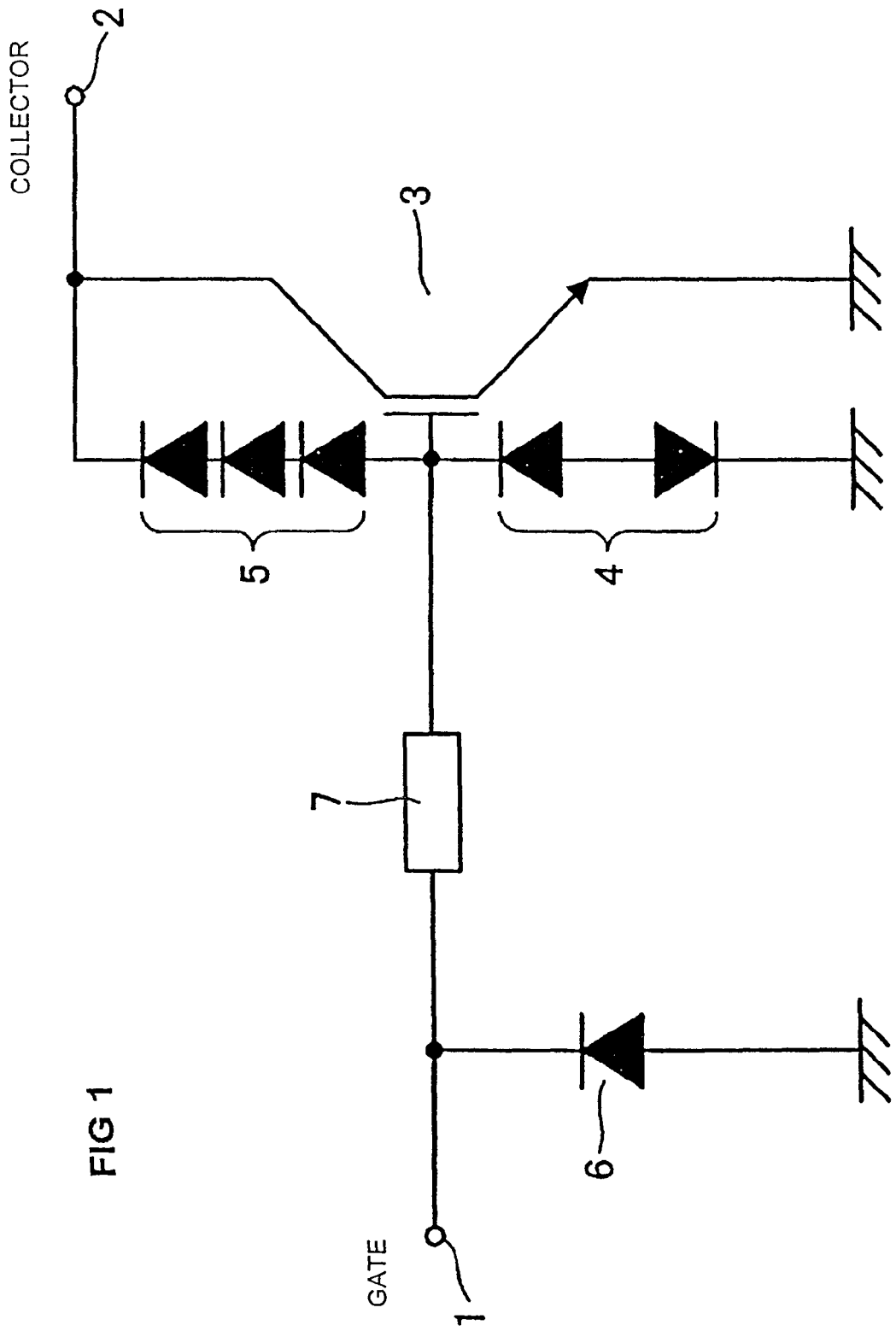
FIG. 1 is a circuit diagram showing a semiconductor switch having a constant voltage circuit according to Embodiment 1.
Figure 2:
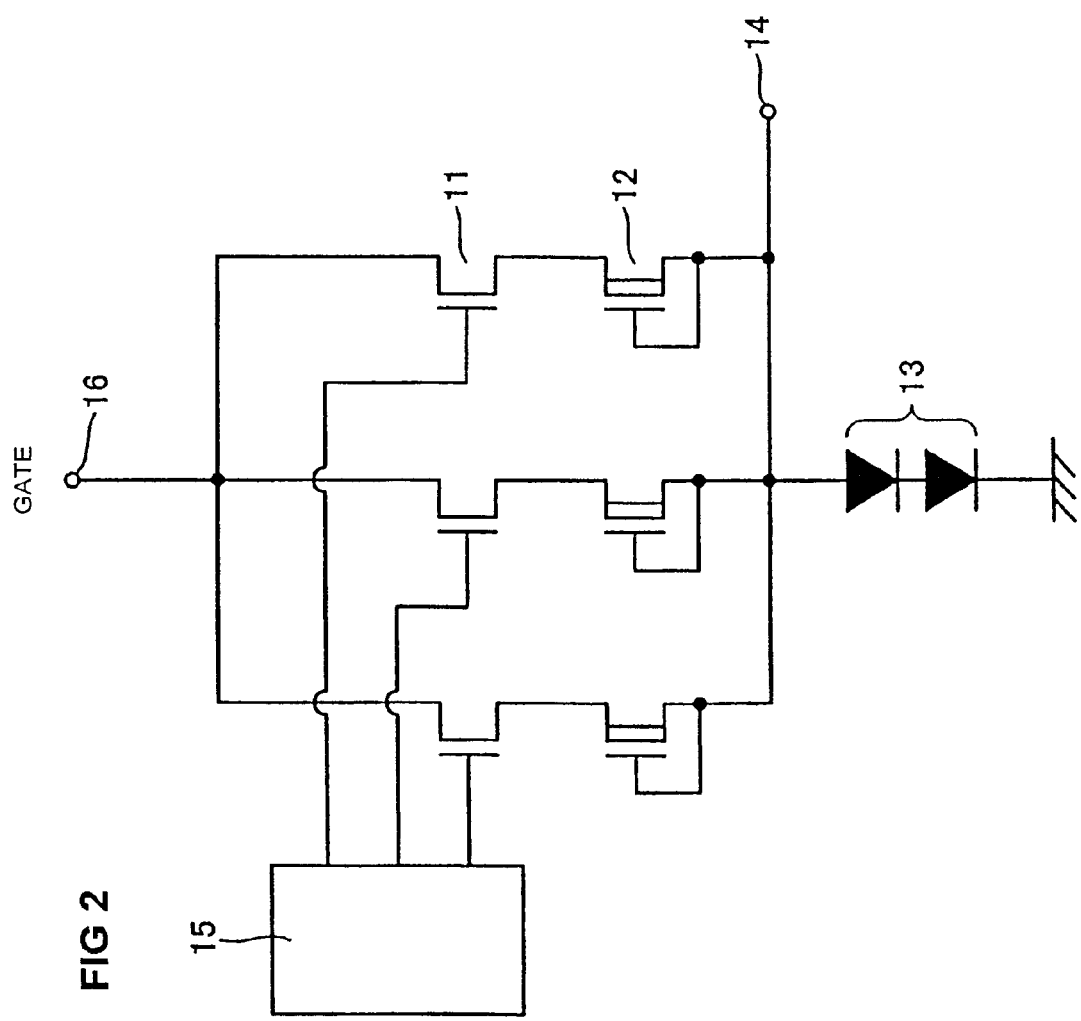
FIG. 2 is a circuit diagram showing an example of the constant voltage circuit according to Embodiment 1.
Figure 18:
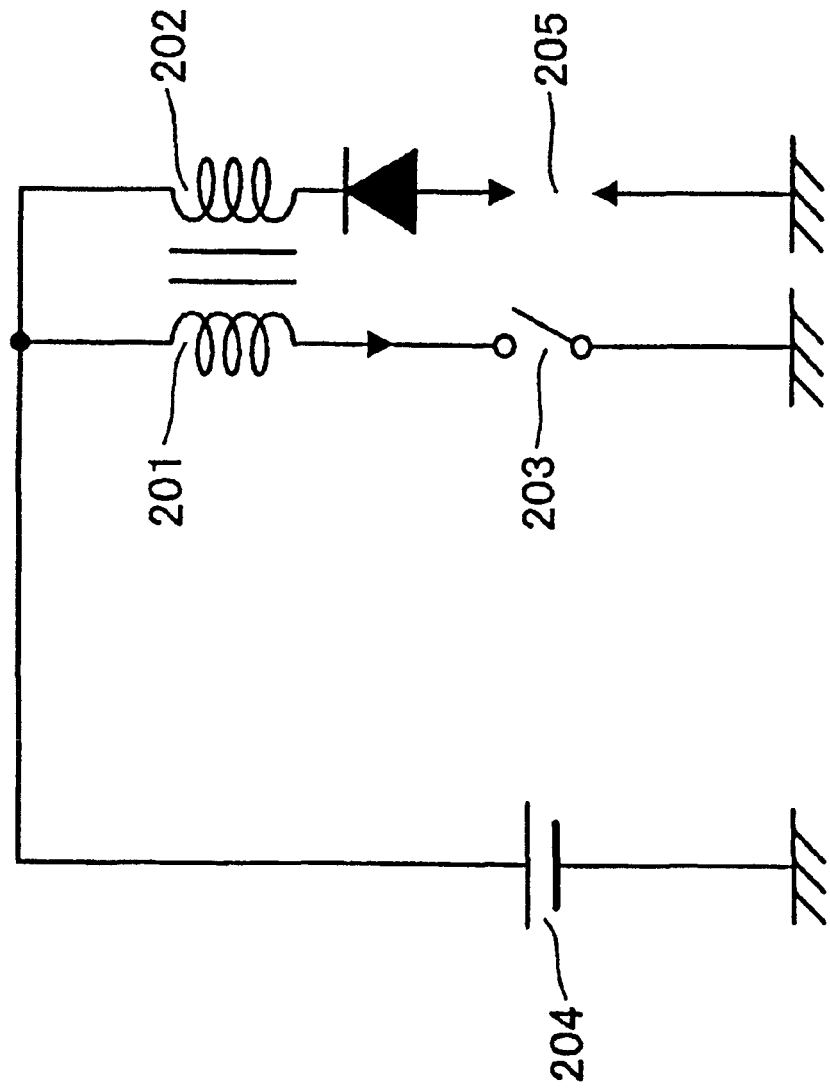
FIG. 18 is a conceptual diagram showing an example of an internal combustion engine ignition device.
Figure 19:
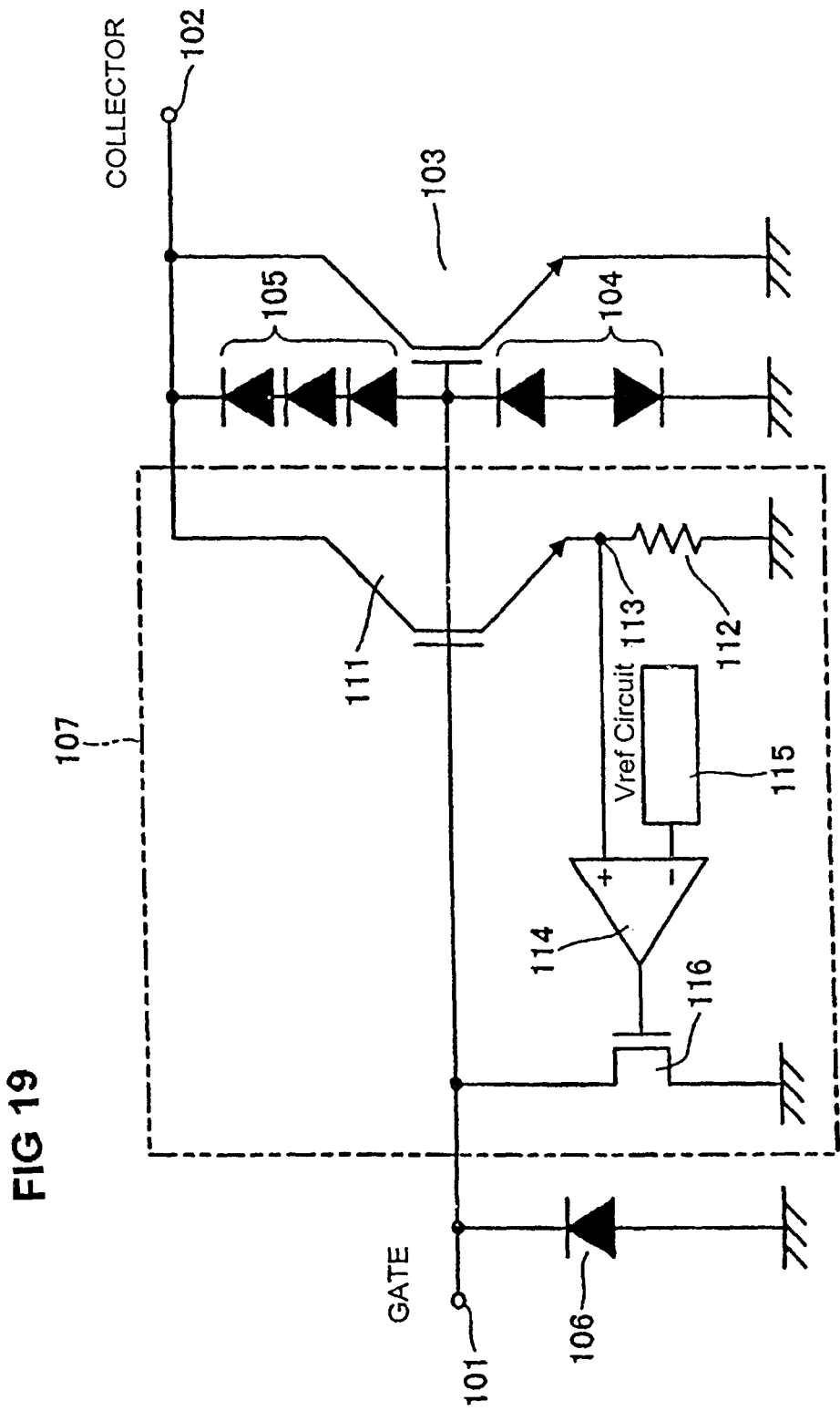
FIG. 19 is a circuit diagram showing an example of an internal combustion engine ignition device provided with a current limiting function.
Figure 20:
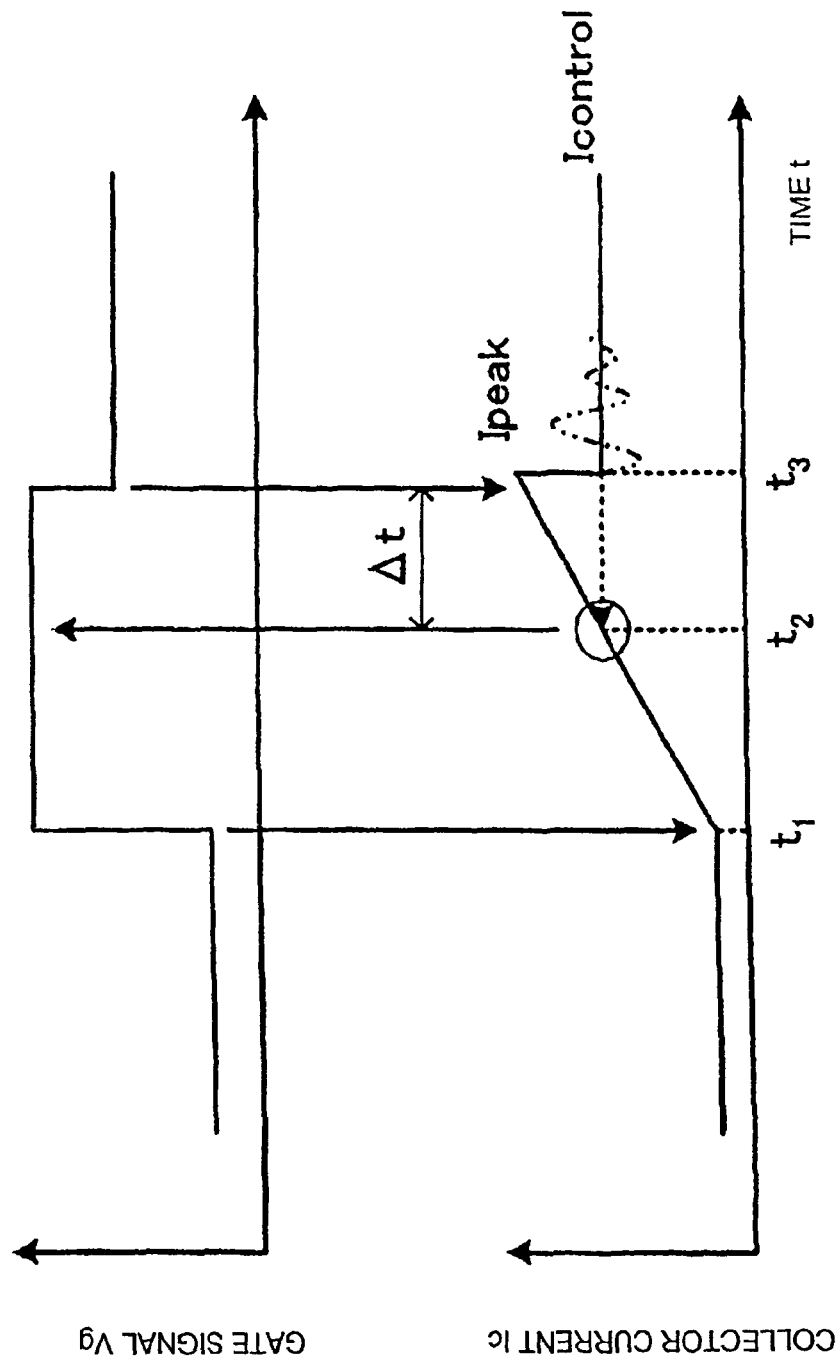
FIG. 20 is a characteristic graph showing the waveforms of a gate signal and a collector current at the time of current limiting operation.

FIG. 1 is a circuit diagram showing a semiconductor switch having a constant voltage circuit according to Embodiment 1. FIG. 2 is a circuit diagram showing an example of the constant voltage circuit according to Embodiment 1. As shown in FIG. 1, a semiconductor device including a constant voltage circuit has an IGBT 3 which makes/breaks a low-voltage current flowing in a primary coil (see FIG. 18) and a constant voltage circuit 7 which is connected between an external gate terminal 1 and an external collector terminal 2 and which makes control so that a gate voltage supplied to the IGBT 3 is constant. Zener diodes 4 for protecting a gate of the IGBT 3 are connected between the gate of the IGBT 3 and the ground. Zener diodes 5 for protecting the IGBT 3 are connected between the constant voltage circuit 7 and the external collector terminal 2. A Zener diode 6 for protecting the circuit is connected between the external gate terminal 1 and the ground. An emitter of the IGBT 3 is kept at the ground level.

As shown in FIG. 2, a plurality of depression type MOSFETs 12 connected in parallel to one another are connected in series to diodes 13 in the constant voltage circuit 7. Each depression type MOSFET 12 supplies a different voltage in accordance with variation of a gate voltage supplied from a gate terminal 16. A selection switch 11 is connected to each depression type MOSFET 12. All the selection switches 11 are connected to a selector circuit 15 for selecting a desired voltage. At the time of shipment from the factory, ON/OFF setting of each selection switch 11 is performed in advance by the selector circuit 15 so that voltage variation caused by electric characteristics in semiconductor device manufacturing is adjusted. On this occasion, cathodes of the diodes 13 are kept at the ground level. The constant voltage circuit 7 has a function for converting the gate voltage supplied from the gate terminal 16 into a constant voltage value and supplying the converted voltage from a collector terminal 14 to the IGBT 3 (see FIG. 1).

Figure 3:
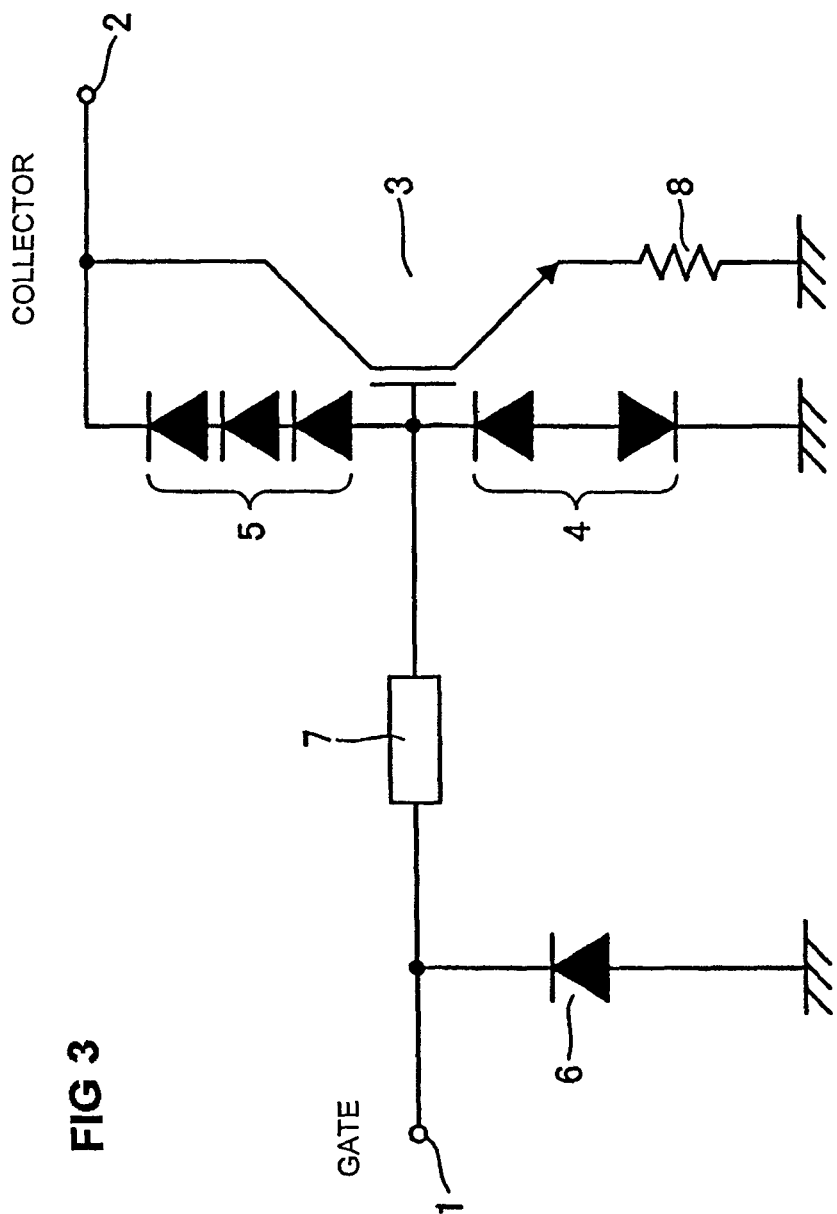
FIG. 3 is a circuit diagram showing another example of the semiconductor switch having the constant voltage circuit according to Embodiment 1.

An emitter resistor may be provided between the emitter of the IGBT 3 and the ground. FIG. 3 is a circuit diagram showing another example of the semiconductor switch having the constant voltage circuit according to Embodiment 1. The semiconductor switch is additionally provided with an emitter resistor 8. When a saturation current flows into the IGBT 3, a practically effective gate voltage of the IGBT 3 decreases due to voltage drop of the emitter resistor 8 so that the saturation current of the IGBT 3 decreases. When a current in a normal operation range flows into the IGBT 3, the voltage drop of the emitter resistor 8 is small so that the influence of the emitter resistor 8 on an on-voltage becomes small. The reason will be described later.

Since a current flowing in the IGBT 3 decreases in accordance with temperature rise of the IGBT 3 in a saturation region, the constant voltage circuit 7 may be provided with a function of increasing the gate voltage in accordance with the temperature rise of the IGBT 3. As a method for providing this function, for example, there is a method of connecting a resistor having positive temperature characteristic in series to the diodes 13 in the constant voltage circuit 7.

As described above, according to Embodiment 1, the IGBT 3 having a saturation current value in a limiting current value range of the semiconductor device is substituted for a current limiting circuit using a sensor IGBT so that a feedback loop can be eliminated by simply keeping the gate voltage at a predetermined value. By use of saturation characteristic of the IGBT 3, the current flowing into the IGBT 3 naturally comes into a current limiting state without exceeding the saturation current value of IGBT 3. For this reason, current overshoot does not occur so that vibration of the waveform of the current flowing in the IGBT 3 can be suppressed. A current limiting circuit requiring a complicate configuration is not used so that a control circuit including the constant voltage circuit 7 can be made small-sized and simple. Thus, the total size of the semiconductor device can be reduced so as to attain cost reduction.

Figure 4:
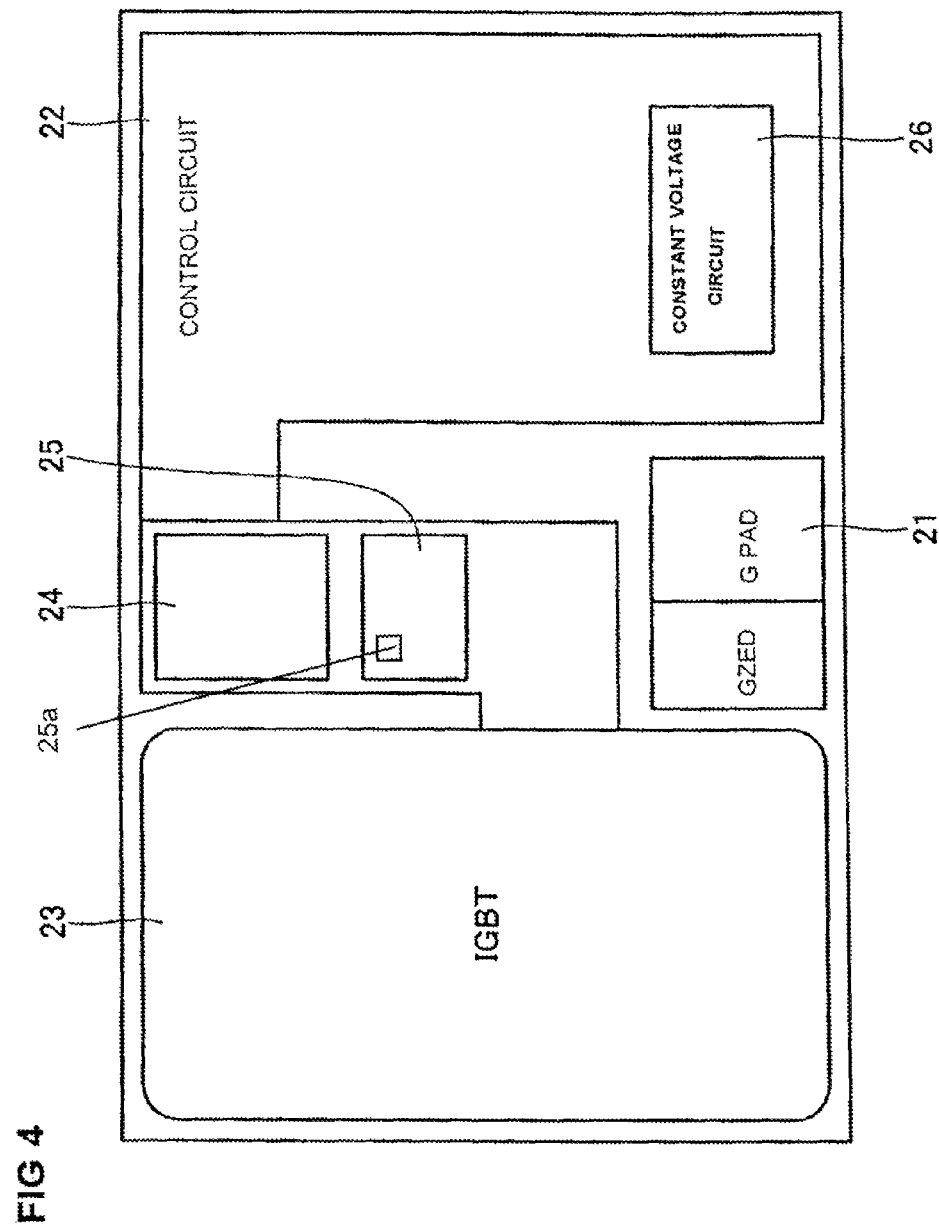
FIG. 4 is a conceptual diagram showing a monolithic semiconductor switch including an IGBT and a control circuit according to Embodiment 2.

A semiconductor switch in which an IGBT and a control circuit for controlling the IGBT are formed integrally will be described. FIG. 4 is a conceptual diagram showing a monolithic semiconductor switch including an IGBT and a control circuit. A gate pad 21, a control circuit 22, an IGBT 23, an emitter pad 24, an emitter resistor 25 and a constant voltage circuit 26 are wired, for example, by electrodes etc. containing aluminum as a main component.(see, for example, aluminum component 25a of resistor 25). An emitter electrode of the IGBT 23 is connected to the emitter pad (E pad) 24 through the emitter resistor 25. The emitter pad 24 is connected to the outside by a bonding wire. The gate pad (G pad) 21 is connected to an external power supply through a bonding wire. The control circuit 22 is connected to the gate pad 21. A voltage supplied from the gate pad 21 is adjusted to a desired voltage value by the constant voltage circuit 26 provided in the control circuit 22 and supplied as a gate voltage to the IGBT 23. In Embodiment 2, the IGBT 23, the constant voltage circuit 26 and the emitter resistor 25 correspond to the IGBT 3, the constant voltage circuit 7 and the emitter resistor 8 (see FIG. 1 and FIG. 3) in Embodiment 1.

As described above, the same effect as Embodiment 1 can be obtained according to Embodiment 2. When the IGBT and the control circuit are formed on one semiconductor substrate, the total size of the semiconductor switch can be reduced. Further, the portion where each electrode is connected by the bonding wire etc. can be reduced to the minimum. Therefore, a semiconductor switch with excellent reliability can be produced.

Figure 5:
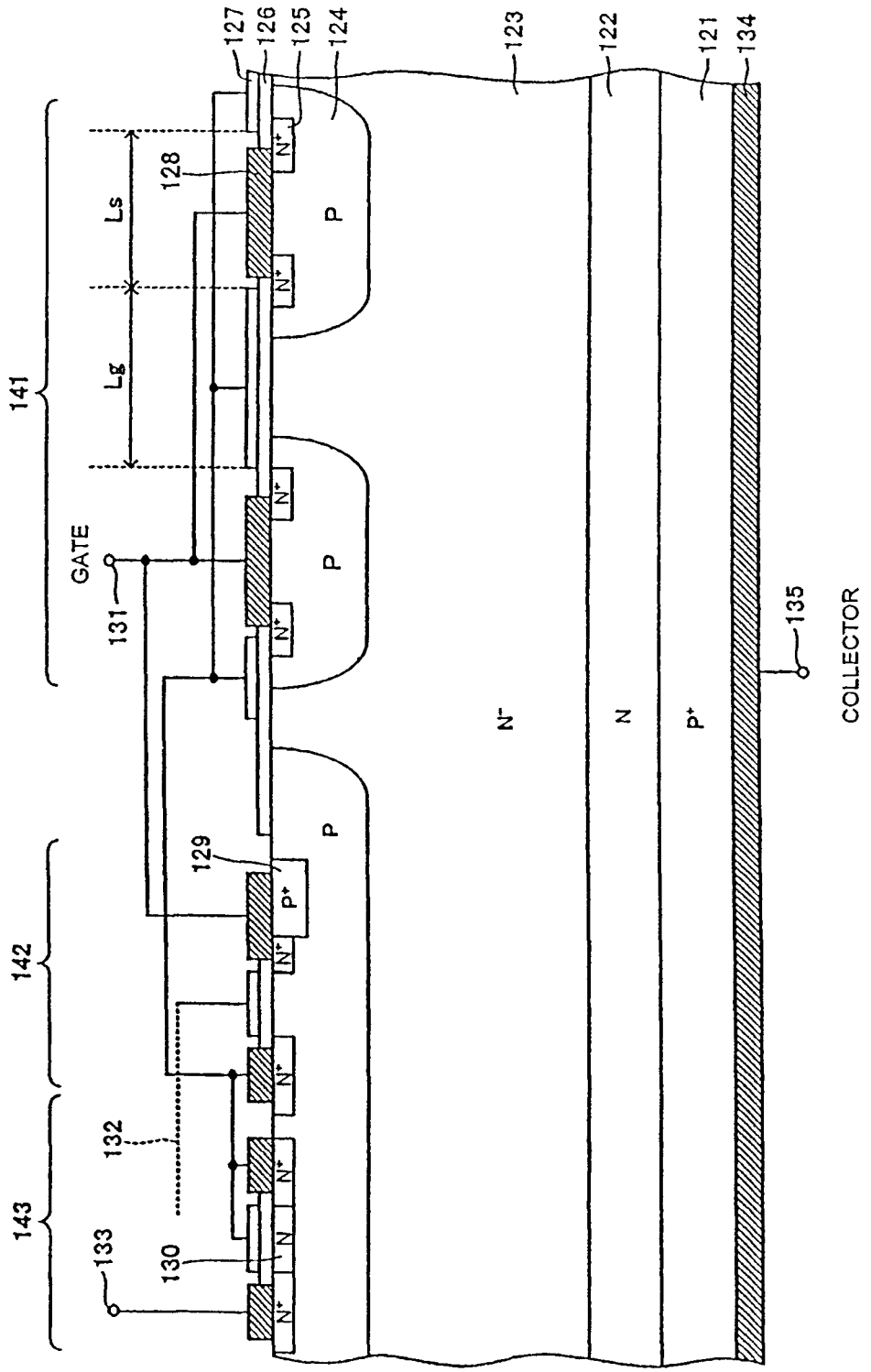
FIG. 5 is a sectional view showing a monolithic semiconductor switch including a planar gate structure IGBT and a control circuit according to Embodiment 3.

A semiconductor switch in which an IGBT and a control circuit for controlling the IGBT are formed integrally on one semiconductor substrate will be described. A planar gate structure IGBT is formed as the IGBT. FIG. 5 is a sectional view showing a monolithic semiconductor switch including the planar gate structure IGBT and the control circuit. As shown in FIG. 5, an IGBT 141, an MOSFET 142 and a depression type MOSFET 143 are provided in a semiconductor substrate in which an n buffer layer 122 and an n⁻ drift layer 123 are formed on a high impurity concentration p-type silicon substrate which is a p⁺ collector layer 121. In the IGBT 141, each p base region 124 is provided in part of a front surface of the n⁻ drift layer 123. Two n⁺ emitter regions 125 are provided separately in parts of a front surface of the p base region 124. In the case where the p base region is shaped like a stripe, there are the case where the n⁺ emitter regions 125 are shaped like two separate stripes and the case where the n⁺ emitter regions 125 are shaped like a ring with their opposite ends being connected to each other. In the case where the p base region 124 is shaped like a polygonal island, the n⁺ emitter regions 125 are shaped like a polygonal ring. An emitter electrode 128 (hereinafter referred to as first emitter electrode) is provided to extend from the front surface of the p base region 124 to parts of front surfaces of the two n⁺ emitter regions 125. A gate electrode 127 is provided through a gate insulating film 126 on a front surface of the semiconductor chip except the portion where the emitter electrode 128 contacts. A collector electrode 134 is provided on the back surface of the p⁺ collector layer 121. A gate terminal 131 and a collector terminal 135 are provided respectively on the emitter side and the collector side of the semiconductor chip.

A p base region 124 and n⁺ emitter regions 125 are formed in the MOSFET 142, similarly to the IGBT 141. Further, a p⁺ high concentration region 129 is formed adjacently to one of the n⁺ emitter regions 125 in a front surface of the p base region 124. An emitter electrode 128 (hereinafter referred to as second emitter electrode) is provided to extend from part of the front surface of the n⁺ emitter region 125 to part of the front surface of p⁺ high concentration region 129. An emitter electrode 128 (hereinafter referred to as third emitter electrode) is provided on part of the front surface of the other n⁺ emitter region 125. A gate electrode 127 is provided through a gate insulating film 126 on the front surface of the semiconductor chip except the portions where the emitter electrodes 128 contact. The second emitter electrode is connected to the gate terminal 131. The third emitter electrode is connected to the gate electrode 127 of the IGBT 141. A wiring 132, for example, for accepting an internal signal of a power voltage etc. is provided in the gate electrode 127.

Similarly to the MOSFET 142, a p base region 124, n⁺ emitter regions 125, a gate insulating film 126, a gate electrode 127 and emitter electrodes 128 are formed in the depression type MOSFET 143. An n high concentration region 130 is provided to be adjacent to the two n⁺ emitter regions 125. One of the emitter electrodes 128 (hereinafter referred to as fourth emitter electrode) and the gate electrode 127 are connected to the third emitter electrode of the MOSFET 142. An external terminal 133 for making connection to a constant voltage circuit (the constant voltage circuit 7 in FIG. 1) is provided in the other emitter electrode 128 (hereinafter referred to as fifth emitter electrode).

Figure 6:
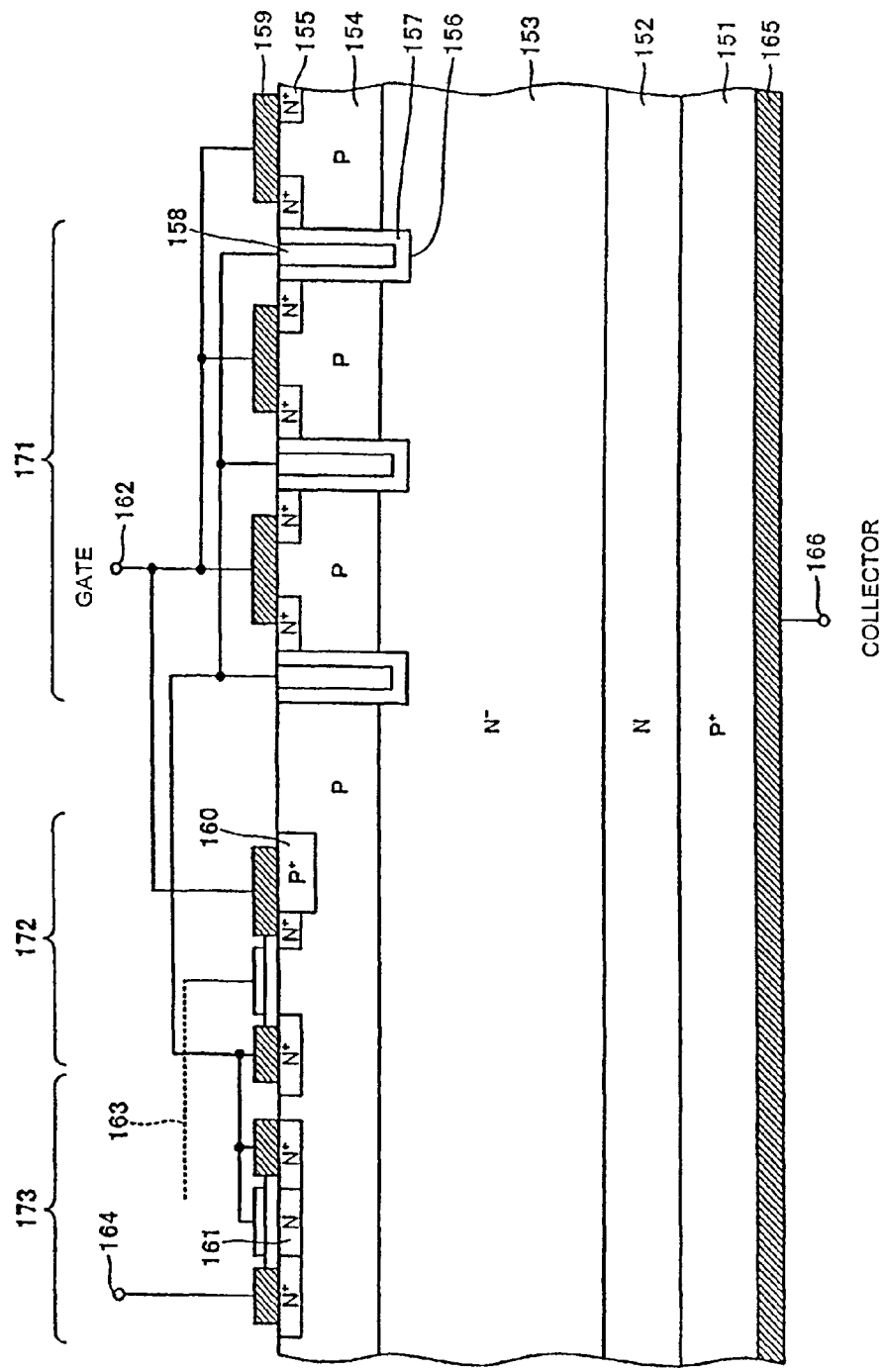
FIG. 6 is a sectional view showing a monolithic semiconductor switch including a trench gate structure IGBT and a control circuit according to Embodiment 3.

Next, another example of an internal combustion engine ignition device in which an IGBT and a control circuit for controlling the IGBT are formed integrally on one semiconductor substrate will be described. A trench gate structure IGBT is formed as the IGBT. FIG. 6 is a sectional view showing a monolithic semiconductor switch including the trench gate structure IGBT and a control circuit. Similarly to the semiconductor switch using the planar gate structure IGBT shown in FIG. 5, an IGBT 171, an MOSFET 172 and a depression type MOSFET 173 are provided in one semiconductor substrate. As shown in FIG. 6, a p base region 154 is formed on a front surface of an n⁻ drift layer 153 in a semiconductor substrate in which an n buffer layer 152 and the n⁻ drift layer 153 are formed on a high impurity concentration p-type silicon substrate which is a p⁺ collector layer 151. An n⁺ emitter region 155 is provided in part of a front surface of the p base region 154. A trench 156 is provided to penetrate the n⁺ emitter region 155 so as to reach the n⁻ drift layer 153. A gate electrode 158 is provided through a gate oxide film 157 in the inside of the trench 156. An emitter 159 (first emitter electrode) is provided on the gate oxide film 157 and the gate electrode 158 through an insulating film not shown. The emitter electrode 159 is provided to be in contact with the p base region 154 and part of the n⁺ emitter region 155. A collector electrode 165 is provided on a back surface of the p⁺ collector layer 151. A gate terminal 162 and a collector terminal 166 are provided respectively on the emitter side and the collector side of the semiconductor chip.

In the MOSFET 172 and the depression type MOSFET 173, a p⁺ high concentration region 160 and an n high concentration region 161 are formed, similarly to the MOSFET 142 and the depression type MOSFET 143 of the semiconductor switch shown in FIG. 5. A wiring 163 for accepting an internal signal and an external terminal 164 for making connection to a constant voltage circuit are provided. A first emitter electrode to a fifth emitter electrode and other electrodes are connected, similarly to the semiconductor switch shown in FIG. 5.

Since a trench gate structure IGBT is used as the IGBT 171, a saturation current value of the IGBT 171 can be controlled more easily than the case where a planar gate structure IGBT (see FIG. 5) is used. The reason will be described later. Particularly when the trench gate structure IGBT is used for setting a current limiting value of the semiconductor device to two to four times as high as a rated current, the trench gate structure IGBT can exert its effect greatly. The effect of the MOSFET 172 and the depression type MOSFET 173 is the same as that of the MOSFET 142 and the depression type MOSFET 143 in the semiconductor substrate shown in FIG. 5.

As described above, the same effect as Embodiment 2 can be obtained according to Embodiment 3. A planar gate structure IGBT or a trench gate structure IGBT can be used as the IGBT. In the case where the trench gate structure IGBT is used, the saturation current value of the IGBT can be controlled easily compared with the case where the planar gate structure IGBT is used.

Figure 7:
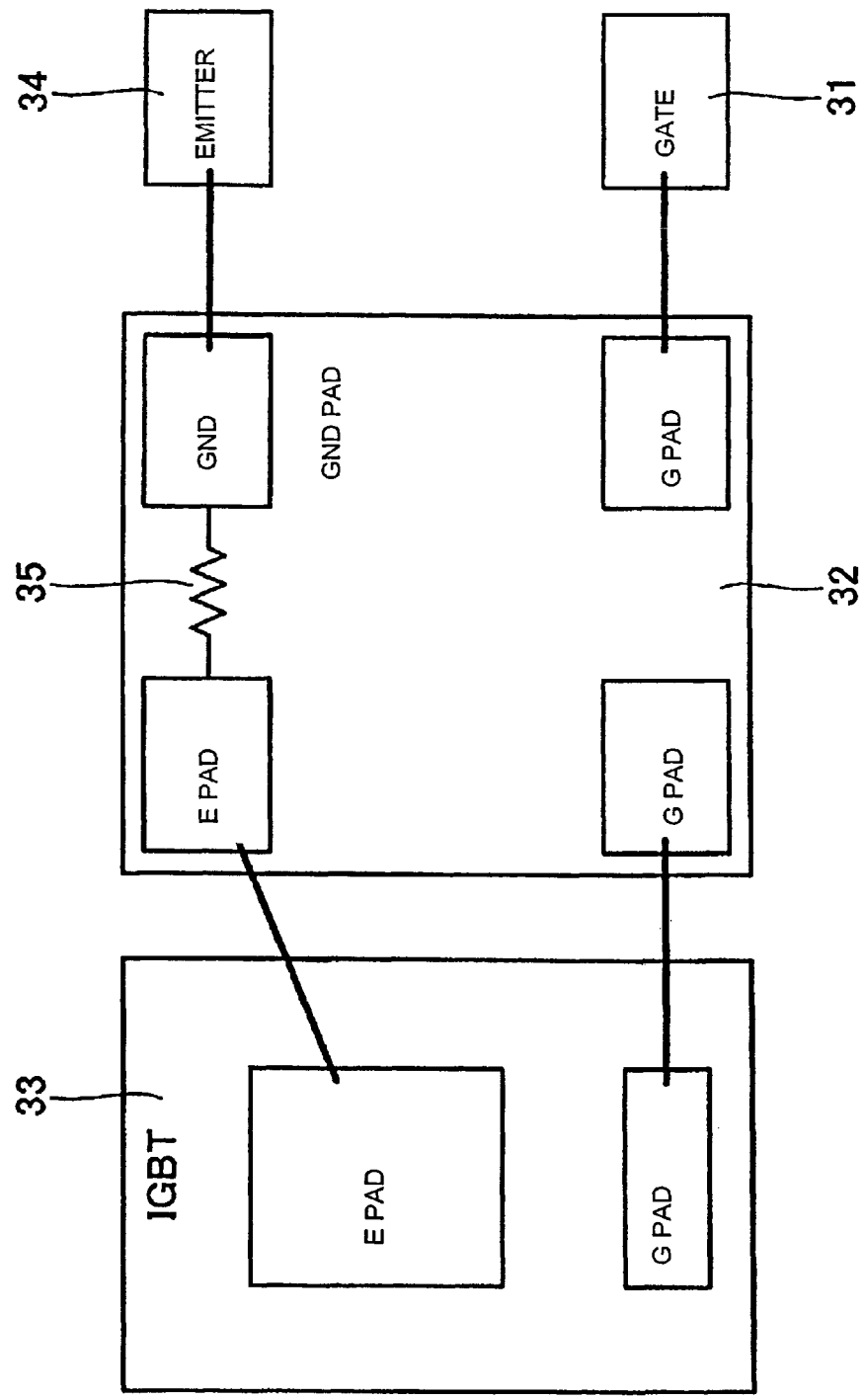
FIG. 7 is a conceptual diagram showing a semiconductor switch having an IGBT and a control circuit formed on different semiconductor substrates separately according to Embodiment 4.

A semiconductor switch in which an IGBT and a control circuit for controlling the IGBT are formed on different semiconductor substrates separately will be described. FIG. 7 is a conceptual diagram showing a semiconductor switch in which an IGBT and a control circuit are formed in different semiconductor substrates separately.

Similarly to the semiconductor switch shown in FIG. 4, an emitter pad (E pad) of an IGBT 33 is connected to an emitter pad of a control circuit 32, for example, by a bonding wire containing aluminum as a main component. An emitter resistor 35 is connected between the emitter pad of the IGBT 33 and an external emitter terminal 34 through a ground pad (GND pad) of the control circuit 32. Similarly, a gate pad (G pad) of the IGBT 33 is connected to an external gate terminal 31 through a gate pad of the control circuit 32, for example, by a bonding wire containing aluminum as a main component. A gate voltage supplied from the external gate terminal 31 and adjusted by the control circuit 32 is fed to the IGBT 33. In Embodiment 4, the IGBT 33, the control circuit 32 and the emitter resistor 35 correspond to the IGBT 23, the control circuit 22 and the emitter resistor 25 in Embodiment 2 respectively (see FIG. 4).

Preferably, an electrode containing aluminum as a main component is used as the emitter resistor 35. This is because a low resistance emitter resistor 35 is required for avoiding heat generation or breakdown of the IGBT 33 when an overcurrent flows in the IGBT 33. A circuit for temperature detection etc. may be provided in the control circuit 32.

As described above, since the IGBT 33 and the control circuit 32 are formed separately on different semiconductor substrates according to Embodiment 4, the IGBT 33 and the control circuit 32 can be produced in the most suitable manufacturing processes respectively. Therefore, high-level control suitable for the IGBT 33 and the control circuit 32 can be performed.

Figure 8:
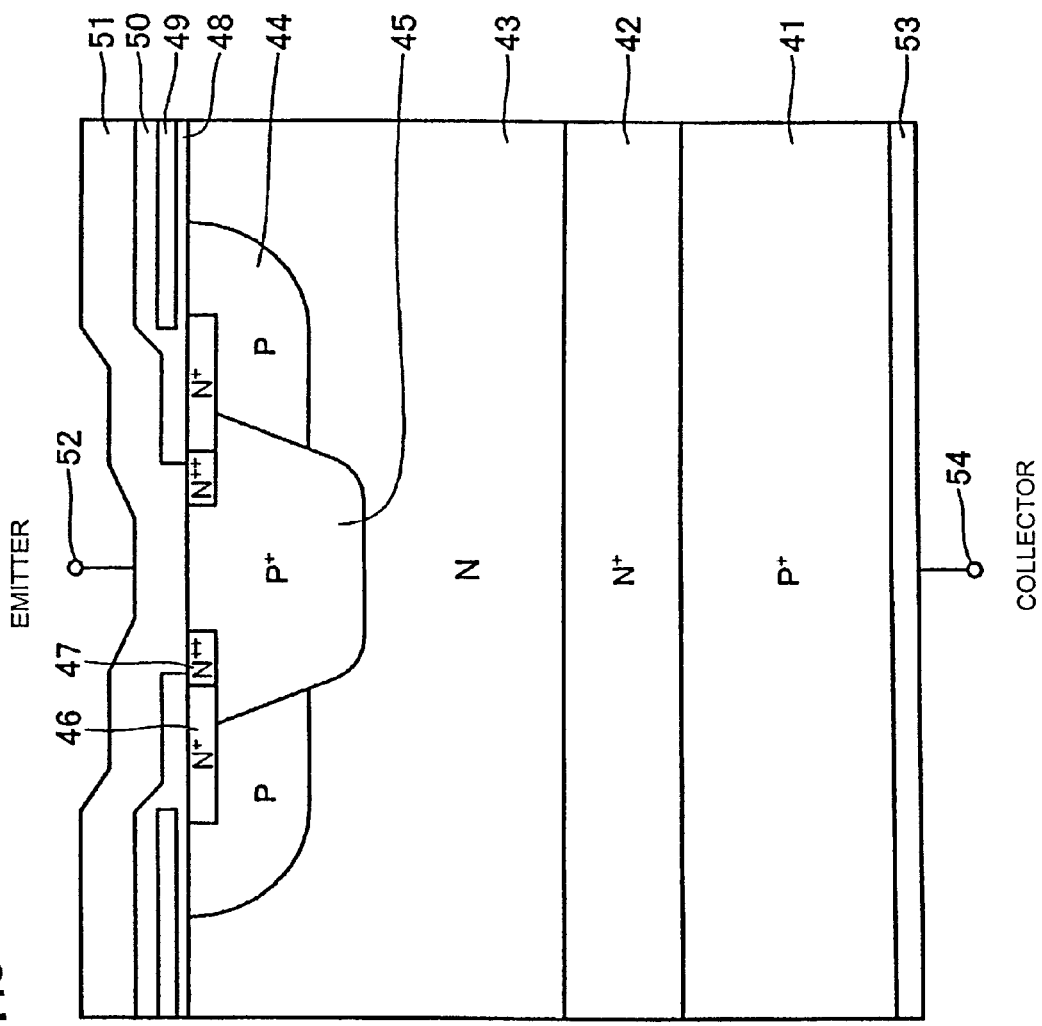
FIG. 8 is a sectional view showing a semiconductor device having an IGBT having built-in resistors according to Embodiment 5.

FIG. 8 is a sectional view showing a semiconductor device in which resistors are built in an IGBT. In Embodiment 5, emitter resistors are formed in a planar gate type IGBT. As shown in FIG. 8, similarly to the planar gate type IGBT (see FIG. 5) in Embodiment 3, an $n^+$ buffer layer 42 and an n drift layer 43 are formed on a front surface of a $p^+$ collector layer 41 and two p base regions 44 are provided separately in parts of a front surface of the n drift layer 43. A $p^+$ contact region 45 is provided in part of a front surface of the n drift layer 43 so as to be adjacent to the two p base regions 44. An $n^+$ resistance region 46 is provided in part of a front surface of each p base region 44 so as to overhang on the $p^+$ contact region 45. Two $n^{++}$ contact regions 47 are provided separately in a front surface of the $p^+$ contact region 45 so as to be adjacent to the $n^+$ resistance regions 46. The $n^+$ resistance regions 46 and the $n^{++}$ contact regions 47 are emitter regions. Gate electrodes 49 are provided respectively on the p base regions 44 through gate insulating films 48. Each gate insulating film 48 extends to be put on the $n^+$ resistance region 46. An emitter electrode 51 is insulated from the gate electrodes 49 by interlayer insulating films 50 and is in contact with the $p^+$ contact region 45 and the $n^{++}$ contact regions 47. The $n^{++}$ contact regions 47 form ohmic junctions with the emitter electrode 51. A collector electrode 53 is provided on a back surface of the $p^+$ collector layer 41. An emitter terminal 52 and a collector terminal 54 are provided respectively on the emitter side and the collector side of the semiconductor chip.

When the potential of each p base region 44 is substantially kept at the ground level, the $n^+$ resistance region 46 serves as the emitter resistor (the emitter resistor 8 in FIG. 3) in Embodiment 1. That is, the emitter resistor is built in each $n^+$ emitter region of the IGBT. For this reason, an installation area of about 1 mm$^2$ which is required when, for example, the emitter resistor is made of an aluminum electrode can be dispensed with so that the total size of the semiconductor device can be reduced.

Preferably, the impurity concentration of each $n^+$ resistance region 46 for forming the emitter resistor is high, for example, to be about $5 \times 10^{17}$ cm$^{-3}$. This is because the value of each emitter resistor varies due to the influence of a p-type region such as the p base region 44 when the impurity concentration of the $n^+$ resistance region 46 is reduced. In addition, preferably, the impurity concentration of each $n^{++}$ contact region 47 is an impurity concentration, for example, of not smaller than $1 \times 10^{19}$ cm$^{-3}$. It is because the semiconductor device can be designed easily without being affected by p-type regions such as the p base regions 44. The $p^+$ contact region 45 has an effect of preventing operation of a thyristor portion of the IGBT (latch-up) and an effect of forming ohmic junction with the emitter electrode 51.

As described above, according to Embodiment 5, the emitter resistors can be formed in the IGBT so that the total size of the semiconductor device can be further reduced, compared with the semiconductor switch shown in each of Embodiments 1 to 4. The potential of each p base region 44 is kept at the ground level so that only the potential of the $n^+$ resistance region 46 increases. Therefore, a threshold of the depression type MOSFET (see FIG. 2) in the constant voltage circuit increases due to a bias effect of the semiconductor substrate. Thus, saturation characteristic of the IGBT can be obtained effectively.

Figure 9:
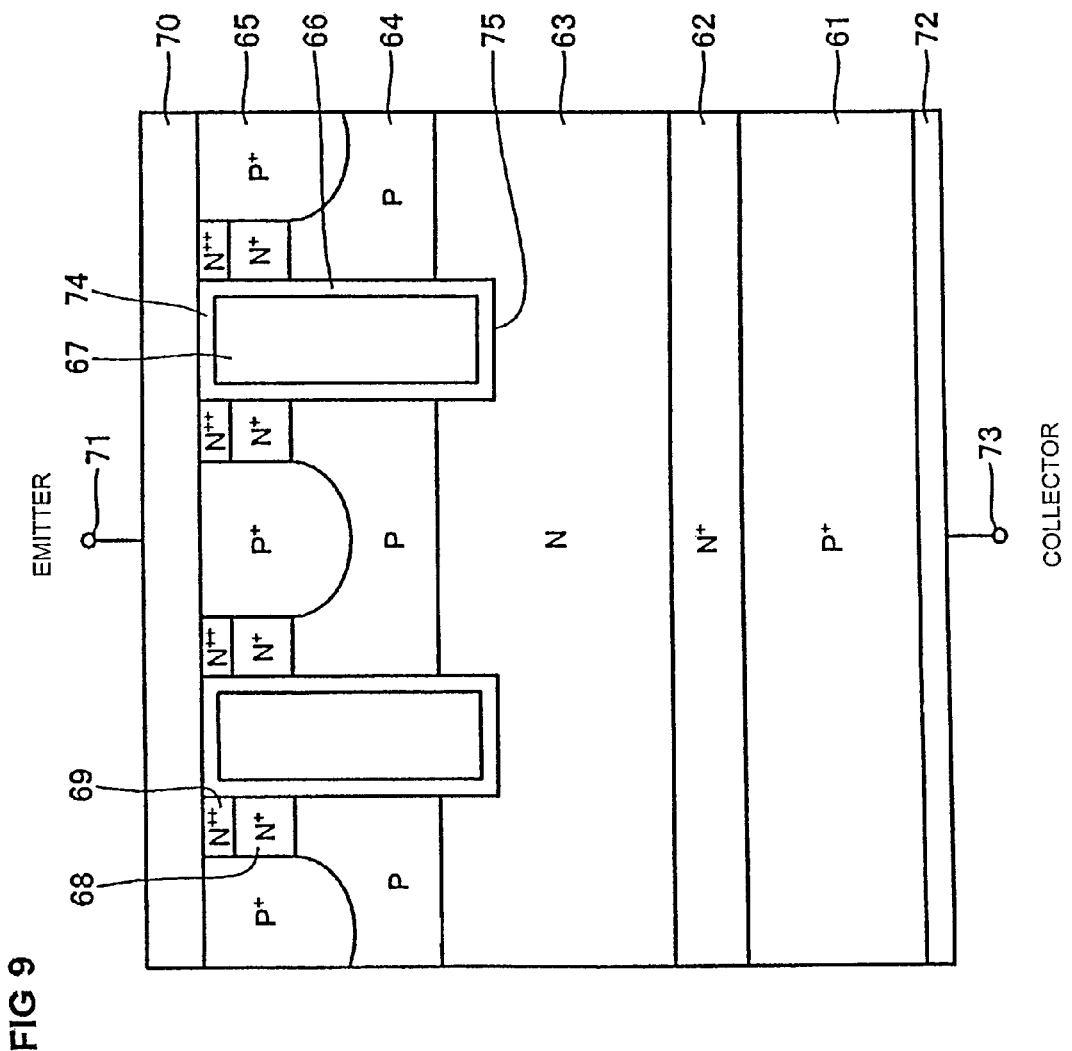
FIG. 9 is a sectional view showing another example of the semiconductor device according to Embodiment 5.

FIG. 9 is a sectional view showing another example of the semiconductor device according to Embodiment 5. In Embodiment 6, each emitter resistor is formed in a trench gate type IGBT. As shown in FIG. 9, similarly to Embodiment 5, an $n^+$ buffer layer 62 and an n drift layer 63 are formed on a front surface of a $p^+$ collector layer 61 and a p base region 64 is provided on a front surface of the n drift layer 63. An $n^+$ resistance region 68 is provided in part of a front surface of the p base region 64. An $n^{++}$ contact region 69 is provided on a front surface of the $n^+$ resistance region 68. The $n^+$ resistance region 68 and the $n^{++}$ contact region 69 are an emitter region. A trench 75 is provided to penetrate the $n^{++}$ contact region 69, the $n^+$ resistance region 68 and the p base region 64 so as to reach the n drift layer 63. A $p^+$ contact region 65 is provided in the front surface of the p base region 64 so as to be separate from the trench 75 but in contact with the $n^+$ resistance region 68, the $n^{++}$ contact region 69 and the p base region 64. A gate electrode 67 is provided in the inside of the trench 75 through a gate oxide film 66. An insulating film 74 is provided on the gate oxide film 66 and the gate electrode 67. The gate electrode 67 and an emitter electrode 70 are separated from each other by the insulating film 74. The emitter electrode 70 is provided so as to be in contact with the $p^+$ contact region 65 and the $n^{++}$ contact region 69. A collector electrode 72 is provided on a back surface of the $p^+$ contact layer 61. An emitter terminal 71 and a collector terminal 73 are provided on the emitter side and the collector side of the semiconductor chip.

In Embodiment 6, similarly to Embodiment 5, the potential of the p base region 64 is substantially kept at the ground level, so that the $n^+$ resistance region 68 serves as an emitter resistor. Preferably, the impurity concentration of the $n^+$ resistance region 68 is high. The reason is the same as Embodiment 5. The effect of the $p^+$ contact region 65 is the same as that in Embodiment 5. Other effects are the same as those in Embodiment 5.

As described above, the same effects as those in Embodiment 5 can be obtained according to Embodiment 6. When the IGBT is formed in a trench gate structure, a low on-voltage can be further achieved so that an effect of the current limiting function can be further improved, compared with Embodiment 5.

Figure 10:
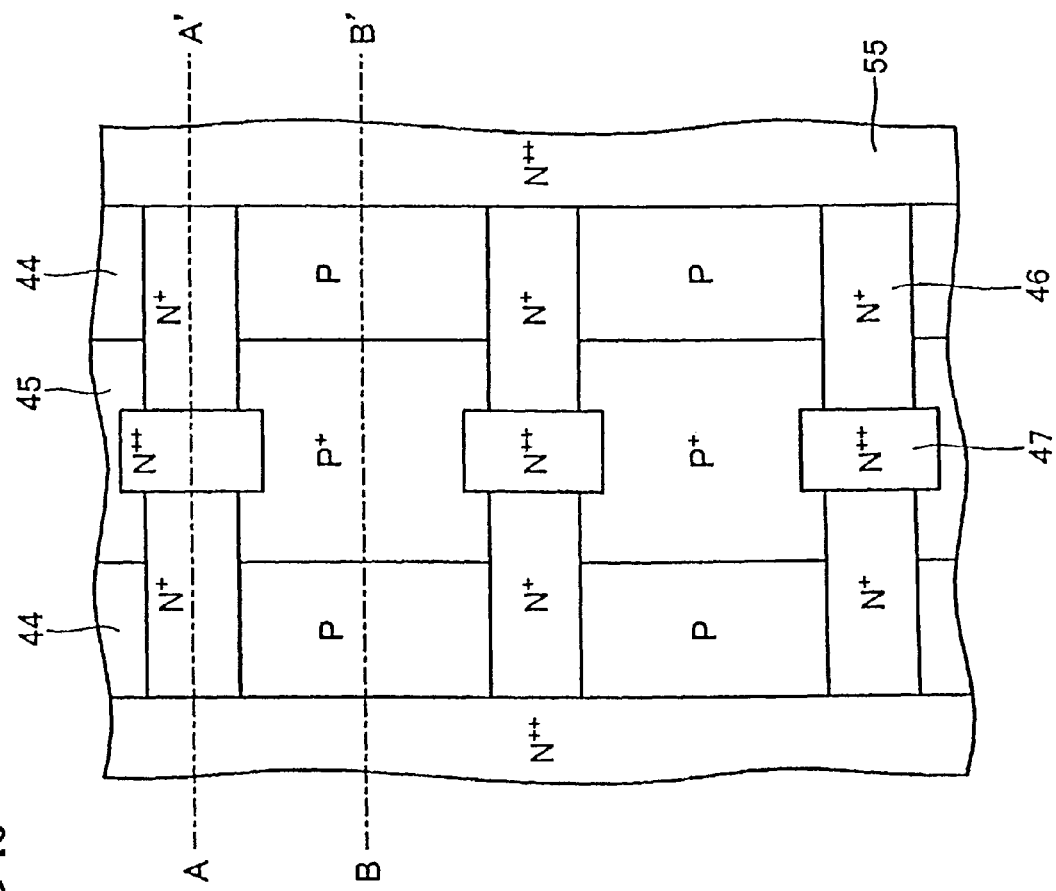
FIG. 10 is a plan view showing a design example of a modification of the semiconductor device according to Embodiment 5.
Figure 11:
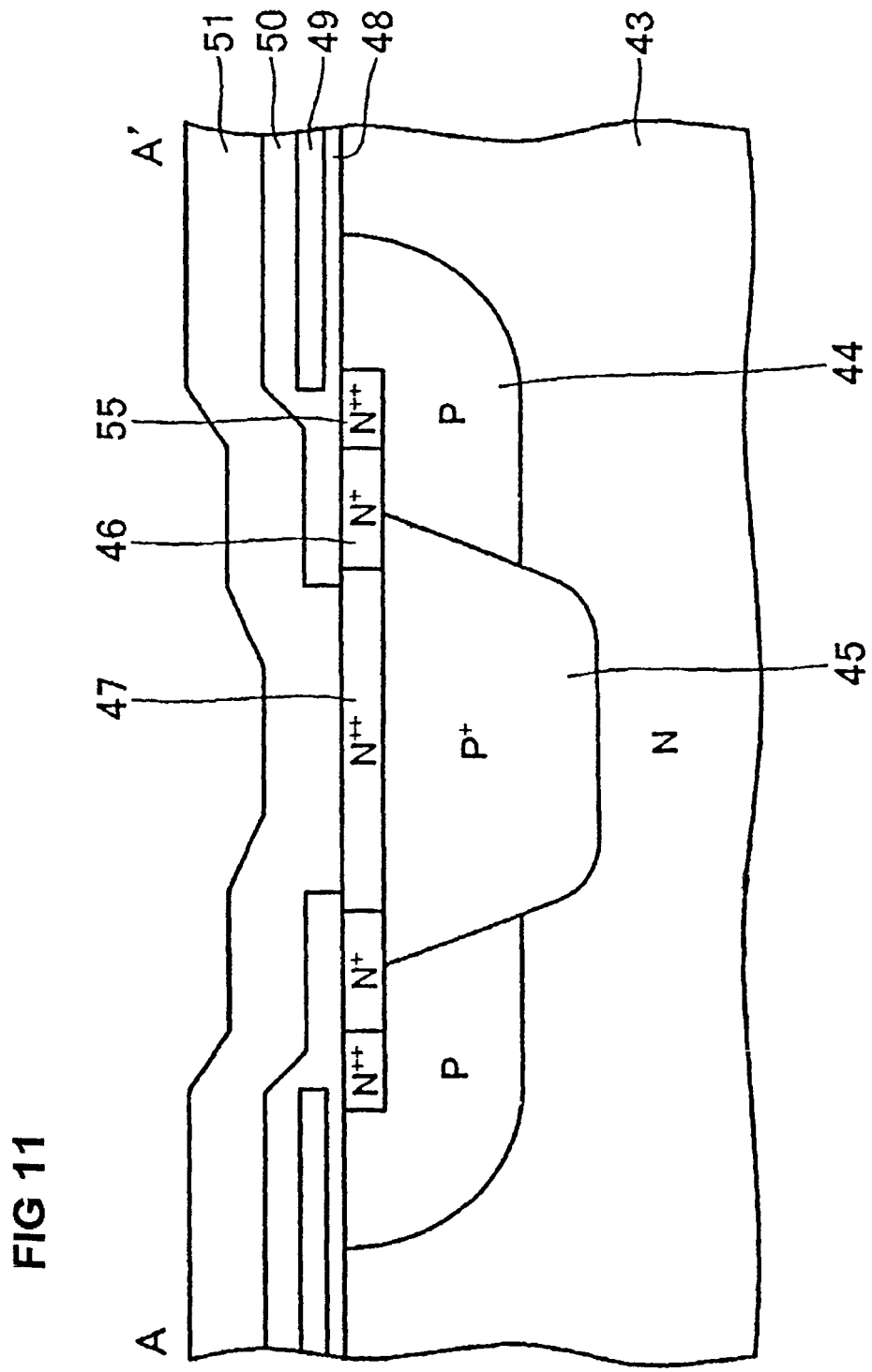
FIG. 11 is a sectional view showing a sectional structure taken along a parting line A-A' in FIG. 10.
Figure 12:
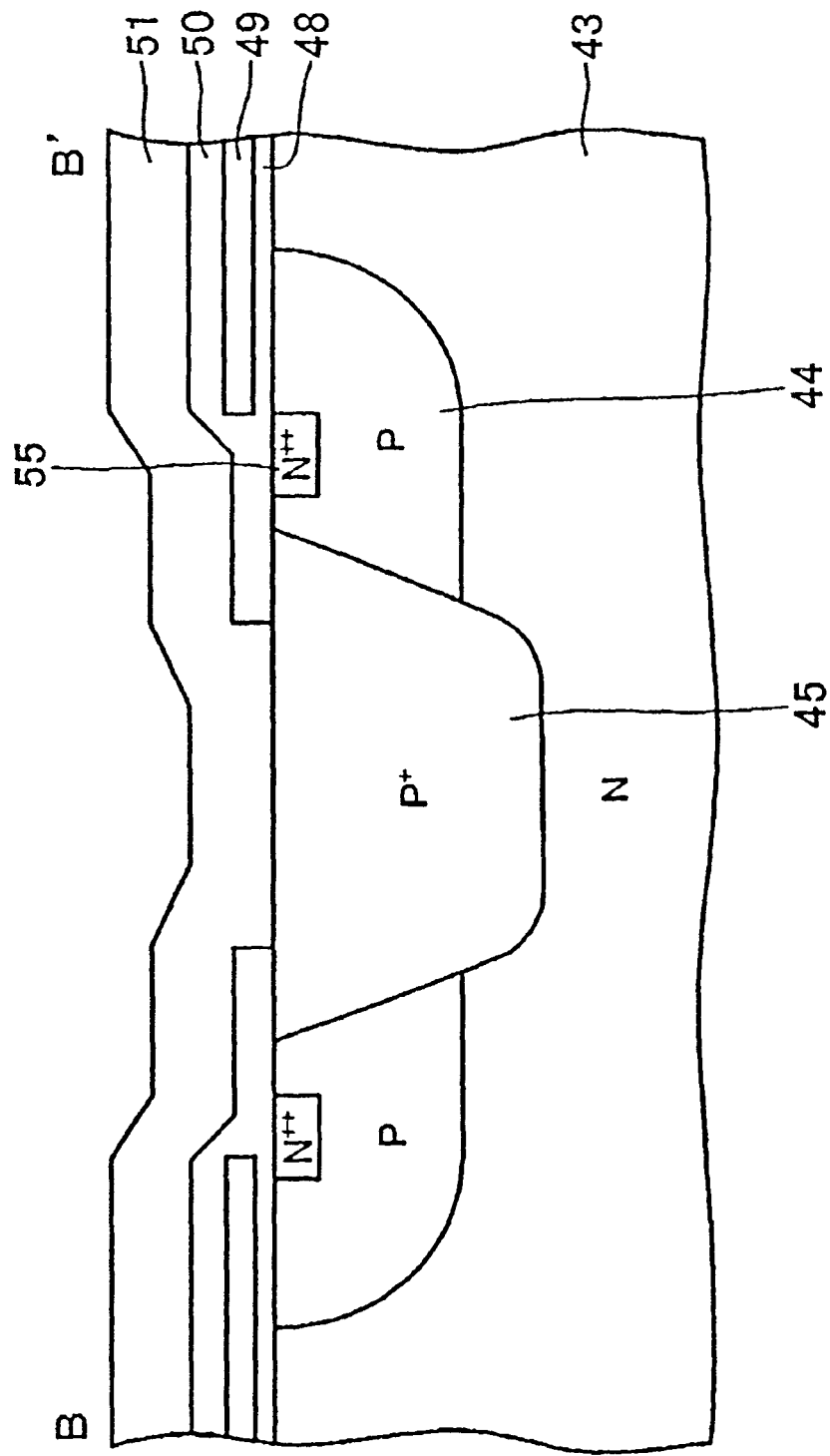
FIG. 12 is a sectional view showing a sectional structure taken along a parting line B-B' in FIG. 10.

FIG. 10 is a plan view showing a design example of a modification of the semiconductor device according to Embodiment 5. FIG. 11 is a sectional view showing a sectional structure taken along a parting line A-A' in FIG. 10. FIG. 12 is a sectional view showing a sectional structure taken along a parting line B-B' in FIG. 10. Incidentally, the plan view shown in FIG. 10 is a design example for a p base region 44, a $p^+$ contact region 45, an $n^+$ resistance region 46, an $n^{++}$ contact region 47, and an $n^{++}$ high concentration region 55. Other parts shown in FIGS. 11 and 12 are omitted in FIG. 10. In Embodiment 7, emitter resistors are formed in a planar gate structure IGBT, similarly to Embodiment 5. As shown in FIG. 10, each region where the $n^+$ resistance regions 46 and the $n^{++}$ contact region 47 are provided, and each region where the $n^+$ resistance regions 46 and the $n^{++}$ contact region 47 are not provided are formed in a depth direction of the semiconductor chip. As shown in FIG. 11, in each region where the $n^+$ resistance regions 46 and the $n^{++}$ contact region 47 are provided, the $n^{++}$ contact region 47 is provided in the whole front surface of the $p^+$ contact region 45. An emitter electrode 51 is not in contact with the $p^+$ contact region 45 but in contact only with the $n^{++}$ contact regions 47. In addition, $n^{++}$ high concentration regions 55 are provided on the sides of gate electrodes 49 of the $n^+$ resistance regions 46. As shown in FIG. 12, only $n^{++}$ high concentration regions 55 are provided in each region where the $n^+$ resistance regions 46 and the $n^{++}$ contact region 47 are not provided. The remaining configuration is the same as that in Embodiment 5.

As described above, the same effects as those in Embodiment 5 can be obtained according to Embodiment 7. In addition, the resistance value of each emitter resistor can be further improved compared with Embodiments 5 and 6.

Figure 13:
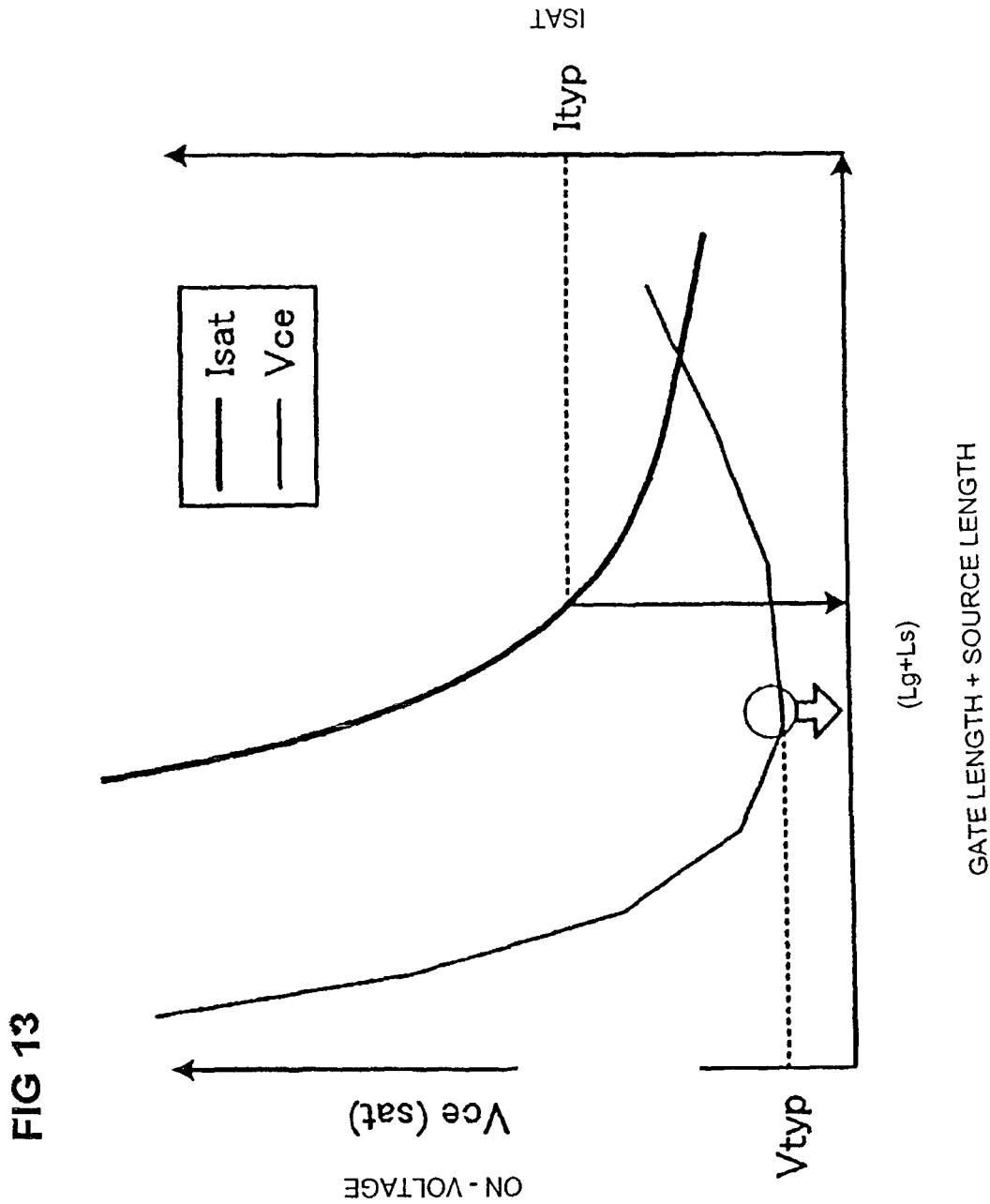
FIG. 13 is a characteristic graph showing the relation between an on-voltage and a saturation current in a planar gate structure IGBT.

Next, a criterion for determining a saturation current value of an IGBT according to the invention will be described. FIG. 13 is a characteristic graph showing the relation between an on-voltage and a saturation current in a planar gate structure IGBT. As shown in FIG. 13, an on-voltage value $V_{ce}$ varies in accordance with a gate length $L_g$ and a source length $L_s$ in the planar gate structure IGBT. A saturation current value $I_{sat}$ of the IGBT also varies in accordance with the gate length $L_g$ and the source length $L_s$. The total value of the gate length $L_g$+the source length $L_s$ at a design point $V_{typ}$ where the on-voltage value becomes the minimum is different from that at a point where the saturation current value of the IGBT becomes the minimum. That is, even when the on-voltage value turns to increase from the minimum, the saturation current value $I_{sat}$ decreases continuously. The desired saturation current value of the IGBT means a saturation current value of the IGBT in a range not higher than a limiting current value $I_{typ}$ of the IGBT. The limiting current value $I_{typ}$ needs to be not smaller than at least a rated current or the maximum current required for ignition operation in an ignition coil because a current needs to flow in a really used current range.

Thus, it can be found from the result of FIG. 13 that the point where the saturation current value of the IGBT becomes the minimum is different from the design point $V_{typ}$ where the value of the on-voltage $V_{ce}$ becomes the minimum. That is, when the gate length $L_g$+the source length $L_s$ is set thus, a planar gate structure IGBT can be produced to have a saturation current value $I_{sat}$ in a range not higher than the limiting current value $I_{typ}$ which is different from the design point $V_{typ}$ where the value of the on-voltage $V_{ce}$ becomes the minimum. Here, the gate length $L_g$ and the source length $L_s$ will be described with reference to FIG. 5. The gate length $L_g$ is a width of a gate electrode 127 perpendicular to a depth direction thereof, the gate electrode 127 being formed to extend on an adjacent p base region 124. In addition, the source length $L_s$ is a distance between adjacent gate electrodes 127 on one and the same p base region 124, the distance being perpendicular to the depth direction.

Figure 14:
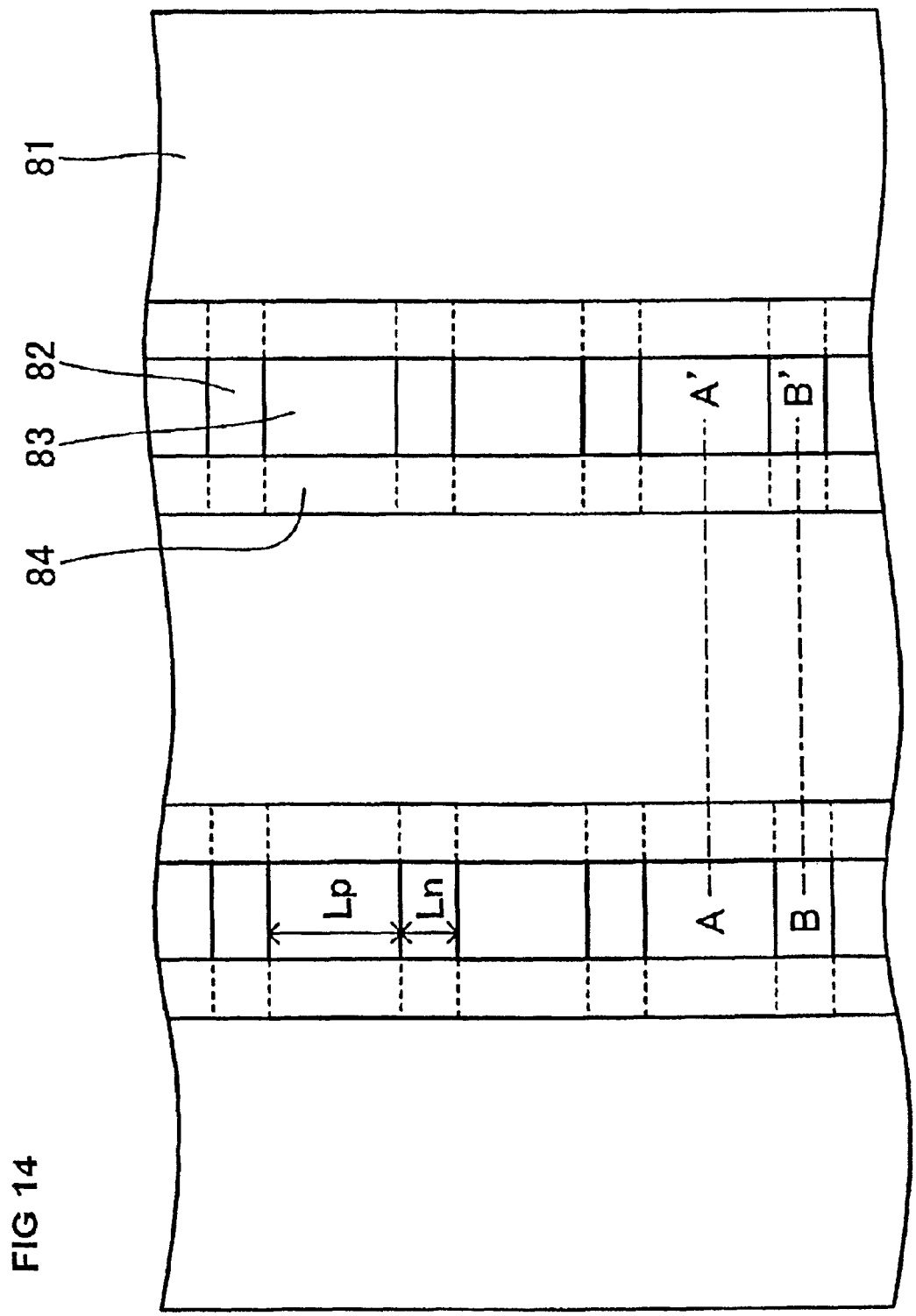
FIG. 14 is a plan view showing an example of design of a planar gate structure IGBT.
Figure 15:
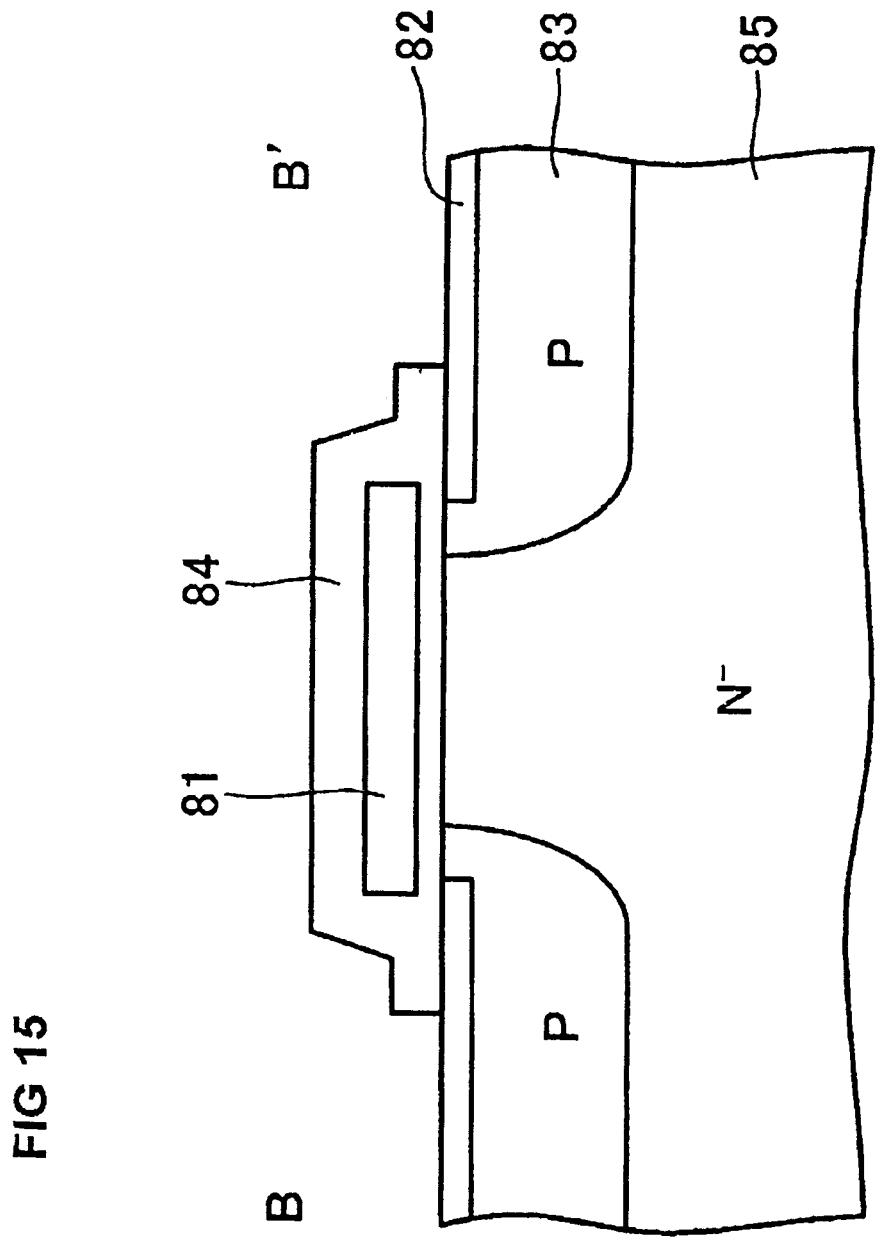
FIG. 15 is a sectional view showing a sectional structure taken along a parting line A-A' in FIG. 14.
Figure 16:
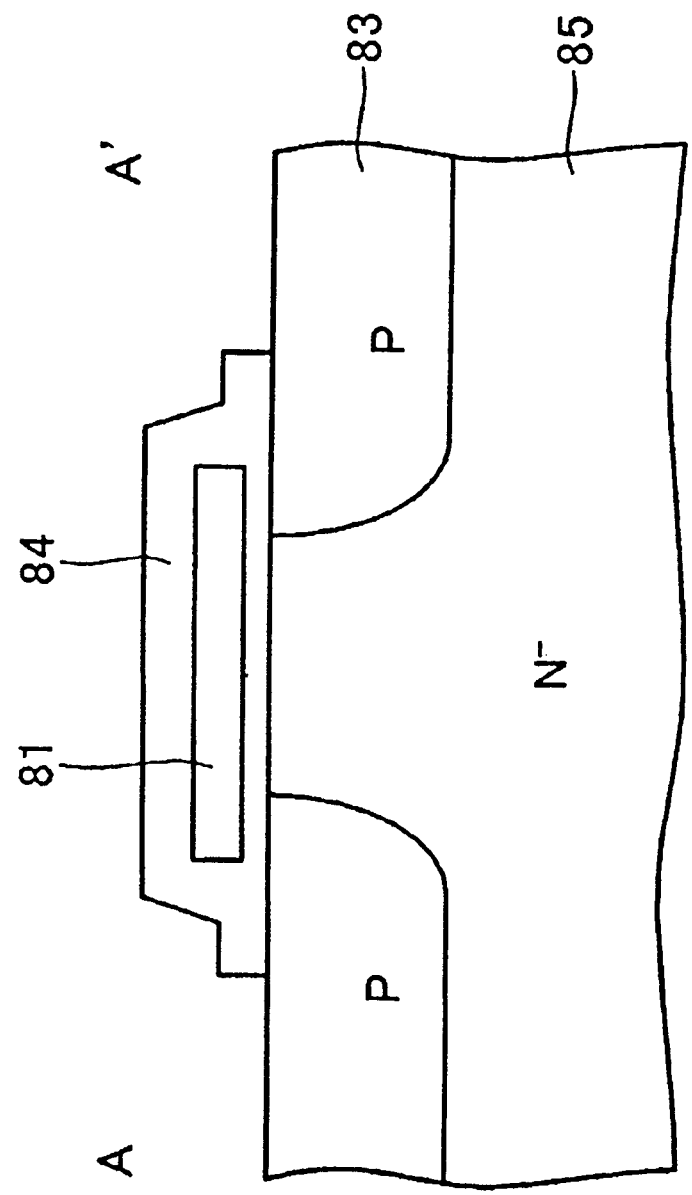
FIG. 16 is a sectional view showing a sectional structure taken along a parting line B-B' in FIG. 14.

The desired saturation current value $I_{sat}$ of the IGBT can be adjusted by the pattern of the IGBT as well as a method of making adjustment in accordance with the total value of (the gate length $L_g$+the source length $L_s$). FIG. 14 is a plan view showing a design example in a planar gate structure IGBT. FIG. 15 is a sectional view showing a sectional structure taken along a parting line A-A' in FIG. 14. FIG. 16 is a sectional view showing a sectional structure taken along a parting line B-B' in FIG. 14. As shown in FIG. 14, $n^+$ source regions 82 are formed into a ladder shape in a front surface of each p base region 83. That is, in the section taken along the parting line A-A' as shown in FIG. 15, two p base regions 83 are provided separately in parts of a front surface of an $n^-$ drift layer 85 and a gate electrode 81 and an insulating oxide film 84 are provided through a gate insulating film on parts of the p base regions 83 and a front surface of the $n^-$ drift layer 85. In the section taken along the parting line B-B' as shown in FIG. 16, the $n^+$ source regions 82 are provided in parts of a front surface of each p base region 83.

When such a pattern of the IGBT is formed and a ratio of a source width $L_n$ of each $n^+$ source region 82 to an inter-source distance $L_p$ between adjacent $n^+$ source regions 82 is changed to reduce the source width $L_n$ of the $n^+$ source region 82, the saturation current value $I_{sat}$ of the IGBT can be reduced. Here, the source width $L_n$ is a width of the $n^+$ source region 82 in a depth direction thereof. On the other hand, the inter-source distance $L_p$ is a distance between adjacent $n^+$ source regions 82 in the depth direction.

Figure 17:
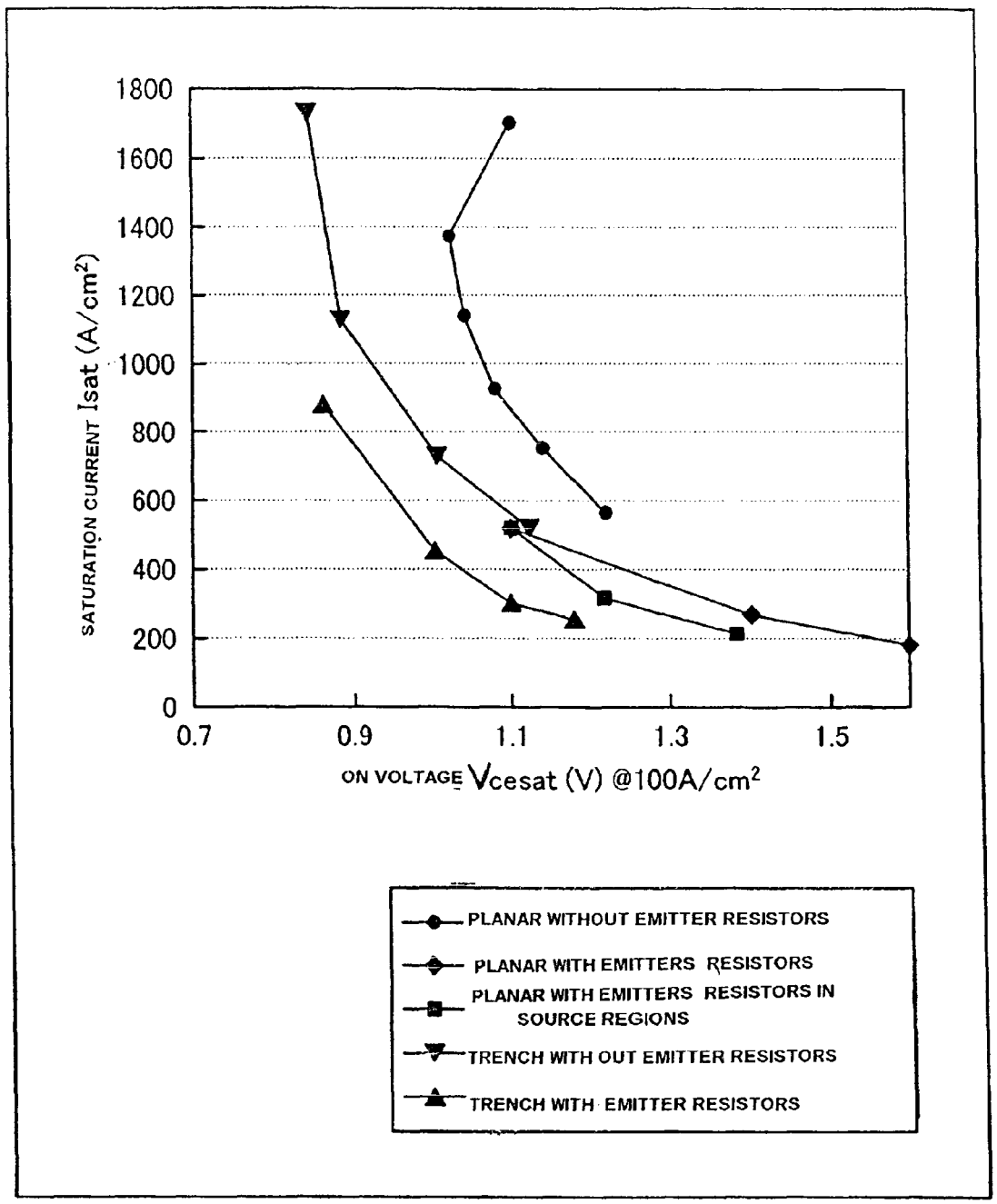
FIG. 17 is a characteristic graph showing the relation between an on-voltage and a saturation current in an IGBT.

Next, change of an on-voltage when a gate voltage of a planar gate structure IGBT or a trench gate structure IGBT is changed so as to reduce a saturation current value will be described. FIG. 17 is a characteristic graph showing the relation between an on-voltage and a saturation current of an IGBT. It is found from results shown in FIG. 17 that the trench gate structure IGBT is lower in the on-voltage and the saturation current value and improved in trade-off characteristic between the on-voltage and the saturation current value, compared with the planar gate structure IGBT. Accordingly, the saturation current value of the trench gate structure IGBT can be reduced at one and the same on-voltage, compared with the planar gate structure IGBT. Thus, the trench gate structure IGBT is easily applied to a device low in limiting current value.

In an IGBT which is used in the internal combustion engine ignition device and which has a voltage value between the collector and the emitter about 400V to 600V, the current density of a normal current is, for example, about 70 to 150 A/cm$^2$. On this occasion, it is necessary to limit the saturation current value of the IGBT to about 2 times as high as the normal current. When the gate voltage is kept constantly, there is a problem that an on-voltage is increased remarkably by a low gate voltage value for limiting the saturation current value as described above. However, the trench gate structure IGBT is excellent in trade-off characteristic between the on-voltage and the saturation current value so that the trench gate structure IGBT can be used effectively as a semiconductor switch of an internal combustion engine ignition device according to the invention.

FIG. 17 shows the relation between an on-voltage and a saturation current with/without emitter resistors in a planar gate structure IGBT and a trench gate structure IGBT. It is found from the results of FIG. 17 that trade-off characteristic between the on-voltage and the saturation current value is further improved when the emitter resistors are provided. It is found that the planar gate structure IGBT is further improved in the trade-off characteristic between the on-voltage and the saturation current value when the emitter resistors are formed in source regions of the IGBT ("planar with emitter resistors in source regions" shown in FIG. 17), similarly to the semiconductor device according to Embodiment 5.

A practically effective gate voltage applied to the IGBT is a voltage difference between the gate voltage and the emitter voltage of the IGBT. For this reason, in the case where the emitter resistors are provided, the voltage of each emitter resistor drops largely in accordance with increase of the current flowing in the IGBT so that the voltage difference between the gate voltage and the emitter voltage of the IGBT decreases. Thus, the saturation current of the IGBT decreases when the practically effective gate voltage applied to the IGBT decreases. In addition, voltage drop of each emitter resistor is small by a current in a normal operation range so that the emitter voltage of the IGBT can be substantially kept at the ground level. For this reason, the practically effective gate voltage is not affected by the emitter resistors so that increase of the on-voltage can be suppressed. In addition, when resistance between the emitter and the ground is generated by the resistance values of the n$^+$ emitter regions of the IGBT, the effect is further enhanced. This is because the potential of each n$^+$ emitter region increases while the p base region of the IGBT is kept at the ground potential so that a threshold voltage V$_{th}$ increases due to a substrate bias effect of the MOSFET to thereby reduce the saturation current more easily.

In the above description, the invention is not limited to the internal combustion engine ignition device but can be applied to a current-limited semiconductor device.

The invention has been described with reference to certain preferred embodiments thereof. It will be understood, however, that modifications and variations are possible within the scope of the appended claims.

This application is based on, and claims priority to, Japanese Patent Application No: 2008-207480, filed on Aug. 11, 2008. The disclosure of the priority application, in its entirety, including the drawings, claims, and the specification thereof, is incorporated herein by reference.

What is claimed is:

1. A semiconductor device comprising:
   an IGBT; and
   a constant voltage circuit which applies a constant voltage to a gate of the IGBT to limit a saturation current value of the IGBT to a value not larger than a limiting current value; wherein
   the constant voltage circuit includes:
      a plurality of diodes connected in series to a plurality of depression type MOSFETs, wherein the depression type MOSFETs are connected in parallel to one another; and
      a plurality of selection switches, each selection switch being connected to a respective one of the depression type MOSFETs.

2. The semiconductor device defined in claim 1, wherein at least the IGBT and the constant voltage circuit are formed integrally on one and the same semiconductor substrate.

3. The semiconductor device defined in claim 1, wherein at least the IGBT and the constant voltage circuit are formed separately on different semiconductor substrates.

4. The semiconductor device defined in claim 1, wherein the IGBT is formed in a trench gate structure or a planar gate structure.

5. The semiconductor device defined in claim 4, wherein at least the IGBT and the constant voltage circuit are formed integrally on one and the same semiconductor substrate.

6. The semiconductor device defined in claim 4, wherein at least the IGBT and the constant voltage circuit are formed separately on different semiconductor substrates.

7. The semiconductor device defined in claim 1, wherein a resistor is connected to an emitter of the IGBT.

8. The semiconductor device defined in claim 7, wherein at least the IGBT and the constant voltage circuit are formed integrally on one and the same semiconductor substrate.

9. The semiconductor device defined in claim 7, wherein at least the IGBT and the constant voltage circuit are formed separately on different semiconductor substrates.

10. The semiconductor device defined in claim 7, wherein the resistor is formed on an emitter-side surface layer of the IGBT.

11. The semiconductor device defined in claim 7, wherein the resistor is formed in a diffusion region in a source region of the IGBT.

12. The semiconductor device defined claim 7, wherein the resistor is formed on a semiconductor substrate where the constant voltage circuit has been formed.

13. The semiconductor device defined in claim 7, wherein the resistor is formed in wiring containing aluminum as a main component.

14. The semiconductor device defined claim 13, wherein the resistor is formed on a semiconductor substrate where the constant voltage circuit has been formed.

15. The semiconductor device defined in claim 7, wherein the IGBT is formed in a trench gate structure or a planar gate structure.

16. The semiconductor device defined in claim 15, wherein at least the IGBT and the constant voltage circuit are formed integrally on one and the same semiconductor substrate.

17. The semiconductor device defined in claim 15, wherein at least the IGBT and the constant voltage circuit are formed separately on different semiconductor substrates.

* * * * *